US012796246B2

(12) United States Patent
Jeon et al.

(10) Patent No.: US 12,796,246 B2
(45) Date of Patent: Nov. 10, 2026

(54) DISPLAY APPARATUS

(71) Applicant: Samsung Display Co., Ltd., Yongin-si (KR)

(72) Inventors: Yujin Jeon, Yongin-si (KR); Sungmin Son, Yongin-si (KR); Yunkyeong In, Yongin-si (KR); Jaejin Song, Yongin-si (KR); Wonse Lee, Yongin-si (KR); Donghyeon Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 706 days.

(21) Appl. No.: 18/318,541

(22) Filed: May 16, 2023

(65) Prior Publication Data

US 2023/0380231 A1 Nov. 23, 2023

(30) Foreign Application Priority Data

May 17, 2022 (KR) ........................ 10-2022-0060448
Nov. 8, 2022 (KR) ........................ 10-2022-0148132

(51) Int. Cl.

*H10K 59/131* (2023.01)
*H10K 59/121* (2023.01)
*H10K 59/122* (2023.01)
*H10K 59/123* (2023.01)
*H10K 59/126* (2023.01)

(52) U.S. Cl.

CPC ......... *H10K 59/131* (2023.02); *H10K 59/121* (2023.02); *H10K 59/122* (2023.02); *H10K 59/123* (2023.02); *H10K 59/126* (2023.02)

(58) Field of Classification Search

CPC .... H10K 59/12; H10K 59/121; H10K 59/122; H10K 59/1213; H10K 59/123–125; H10K 59/131; H01L 23/31; H01L 23/3121; H01L 23/3135; H01L 23/3185; H01L 23/3157; H01L 21/56; H01L 21/563; H01L 21/568; H01L 23/5389; H05K 1/185; H10W 74/00–481; H10W 76/60–67; H10W 42/20–287; H10W 42/121; H10W 72/823

See application file for complete search history.

(56) References Cited

U.S. PATENT DOCUMENTS 7,414,599 B2 8/2008 Chung et al.
7,947,519 B2 5/2011 Lee et al.
(Continued)

FOREIGN PATENT DOCUMENTS

CN 110491918 A 11/2019
CN 110867476 A 3/2020
(Continued)

*Primary Examiner* — Wael M Fahmy
*Assistant Examiner* — Quinton A Brasfield
(74) *Attorney, Agent, or Firm* — Womble Bond Dickinson (US) LLP

(57) ABSTRACT

A display apparatus includes: a sub-pixel circuit in a display area and comprising a plurality of transistors; a data line electrically connected to one of the plurality of transistors of the sub-pixel circuit and extending in a first direction in the display area; a voltage layer having a width greater than a width of the data line and overlapping the data line; and a light-emitting diode comprising a first electrode overlapping the voltage layer, an emission layer on the first electrode, and a second electrode on the emission layer.

20 Claims, 14 Drawing Sheets

(56) References Cited

U.S. PATENT DOCUMENTS

| | | | | |
|---|---|---|---|---|
| 8,188,649 | B2 | 5/2012 | Sung et al. | |
| 9,620,613 | B2 | 4/2017 | Park et al. | |
| 11,456,346 | B2 | 9/2022 | Zhao et al. | |
| 2019/0043938 | A1* | 2/2019 | Lee | G09G 3/20 |
| 2020/0058728 | A1* | 2/2020 | Song | G09G 3/3233 |
| 2021/0083037 | A1 | 3/2021 | Kim et al. | |
| 2021/0202633 | A1* | 7/2021 | Song | G09G 5/00 |
| 2022/0045155 | A1 | 2/2022 | Ma et al. | |
| 2022/0115494 | A1 | 4/2022 | Kim et al. | |
| 2022/0123094 | A1* | 4/2022 | Qiu | H10K 59/121 |
| 2022/0181354 | A1* | 6/2022 | Lee | G09G 3/3258 |
| 2022/0336550 | A1 | 10/2022 | Ma et al. | |

FOREIGN PATENT DOCUMENTS

| | | | |
|---|---|---|---|
| CN | 111627341 | A | 9/2020 |
| CN | 111725287 | A | 9/2020 |
| CN | 111785853 | A | 10/2020 |
| KR | 10-2005-0098596 | A | 10/2005 |
| KR | 10-0560780 | B1 | 3/2006 |
| KR | 10-0864882 | B1 | 10/2008 |
| KR | 10-2021-0033580 | A | 3/2021 |
| KR | 10-2232868 | B1 | 3/2021 |
| KR | 10-2236381 | B1 | 4/2021 |
| KR | 10-2022-0049663 | A | 4/2022 |

* cited by examiner

DISPLAY APPARATUS

CROSS-REFERENCE TO RELATED APPLICATIONS

The present application claims priority to and the benefit of Korean Patent Application Nos. 10-2022-0060448, filed on May 17, 2022, and 10-2022-0148132, filed on Nov. 8, 2022, in the Korean Intellectual Property Office, the entire disclosure of each of which is incorporated herein by reference.

BACKGROUND

1. Field

Aspects of one or more embodiments relate to a display apparatus.

2. Description of the Related Art

In a display panel such as an organic light-emitting display panel, thin-film transistors are arranged in a display area to control the brightness of a light-emitting diode or the like. The thin-film transistors control the light-emitting diode to emit light having a certain color by using a transmitted data signal, a driving voltage, and a common voltage.

To provide the data signal, the driving voltage, the common voltage, or the like, a data driving circuit, a driving voltage supply line, a common voltage supply line, or the like may be arranged in a non-display area outside the display area.

The above information disclosed in this Background section is only for enhancement of understanding of the background and therefore the information discussed in this Background section does not necessarily constitute prior art.

SUMMARY

Aspects of one or more embodiments include a display apparatus capable of providing relatively high-quality images. However, embodiments according to the present disclosure are not limited thereto.

Additional aspects will be set forth in part in the description which follows and, in part, will be apparent from the description, or may be learned by practice of the presented embodiments of the disclosure.

According to one or more embodiments, a display apparatus includes a sub-pixel circuit arranged in a display area and including a plurality of transistors, a data line electrically connected to one of the plurality of transistors of the sub-pixel circuit and extending in a first direction in the display area, a voltage layer having a width greater than a width of the data line and overlapping the data line, and a light-emitting diode including a first electrode overlapping the voltage layer, an emission layer on the first electrode, and a second electrode on the emission layer.

According to some embodiments, the voltage layer may include a transparent conductive material.

According to some embodiments, the display apparatus may further include a common voltage line arranged in the display area and electrically connected to the second electrode of the light-emitting diode, and the voltage layer may have a same voltage level as a voltage level of the common voltage line.

According to some embodiments, the common voltage line may include a first common voltage line and a second common voltage line, which extend to cross each other in the display area, and the voltage layer may correspond to a portion of the first common voltage line.

According to some embodiments, the display apparatus may further include an insulating layer between any one of the first common voltage line and the second common voltage line and the voltage layer, and the voltage layer may be electrically connected to the one of the first common voltage line and the second common voltage line through a contact hole in the insulating layer.

According to some embodiments, the display apparatus may further include a driving voltage line arranged in the display area and electrically connected to the sub-pixel circuit, and the voltage layer may have a same voltage level as a voltage level of the driving voltage line.

According to some embodiments, the driving voltage line may include a first driving voltage line and a second driving voltage line, which extend to cross each other in the display area, and the voltage layer may be electrically connected to a first driving voltage line through a contact hole defined in an insulating layer between the first driving voltage line and the voltage layer.

According to some embodiments, the voltage layer may overlap an emission area of the light-emitting diode.

According to one or more embodiments, a display apparatus includes a first light-emitting diode electrically connected to a first sub-pixel circuit arranged in a first display area, a second light-emitting diode positioned in a second display area inside the first display area and electrically connected to a second sub-pixel circuit in an area different from the second display area, a conductive bus line electrically connecting the second sub-pixel circuit and the second light-emitting diode to each other, a data line electrically connected to one of a plurality of transistors of the first sub-pixel circuit and extending in a first direction in the first display area, and a voltage layer positioned between the data line and a first electrode of the first light-emitting diode and overlapping the data line and the first electrode, wherein the voltage layer has a width greater than a width of the data line.

According to some embodiments, the voltage layer may include a same material as a material of the conductive bus line.

According to some embodiments, each of the voltage layer and the conductive bus line may include a transparent conductive oxide.

According to some embodiments, the display apparatus may further include a common voltage line arranged in the first display area and electrically connected to a second electrode of the first light-emitting diode, and the voltage layer may have a same voltage level as a voltage level of the common voltage line.

According to some embodiments, the common voltage line may include a first common voltage line and a second common voltage line, which extend to cross each other in the first display area.

According to some embodiments, the first common voltage line may overlap the first electrode of the first light-emitting diode.

According to some embodiments, the voltage layer may correspond to a portion of the first common voltage line.

According to some embodiments, the display apparatus may further include an insulating layer between any one of the first common voltage line and the second common voltage line and the voltage layer, and the voltage layer may be electrically connected to the one of the first common voltage line and the second common voltage line through a contact hole in the insulating layer.

According to some embodiments, the display apparatus may further include a driving voltage line arranged in the first display area and electrically connected to the first sub-pixel circuit, and the voltage layer may have a same voltage level as a voltage level of the driving voltage line.

According to some embodiments, the driving voltage line may include a first driving voltage line and a second driving voltage line, which extend to cross each other in the first display area, and the voltage layer may be electrically connected to a first common voltage line through a contact hole defined in an insulating layer between the first common voltage line and the voltage layer.

According to some embodiments, the voltage layer may overlap an emission area of the light-emitting diode.

According to some embodiments, the display apparatus may further include a component overlapping the second display area and including a sensor or a camera.

BRIEF DESCRIPTION OF THE DRAWINGS

The above and other aspects, features, and characteristics of certain embodiments of the present disclosure will be more apparent from the following description taken in conjunction with the accompanying drawings, in which.

DETAILED DESCRIPTION

Figure 1:
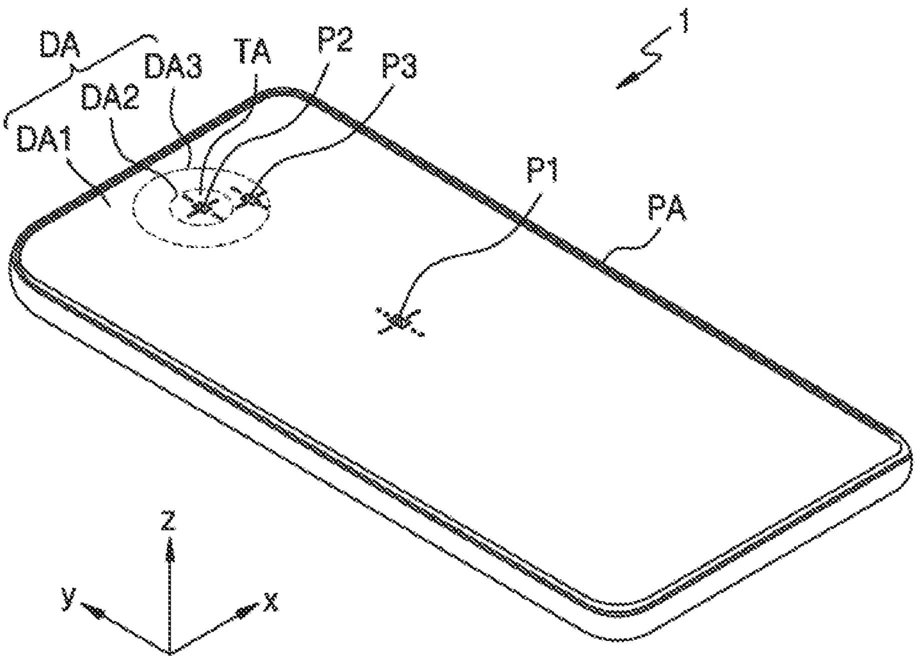
FIG. 1 is a schematic perspective view of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, aspects of some embodiments will be illustrated in the drawings and described in detail in the written description. Effects and features of the disclosure and methods of achieving the same will be apparent with reference to embodiments and drawings described below in detail. The disclosure may, however, be embodied in many different forms and should not be construed as being limited to the embodiments set forth herein.

Aspects of some embodiments of the present disclosure will now be described more fully with reference to the accompanying drawings, in which embodiments of the disclosure are shown. Like reference numerals in the drawings denote like elements, and thus their description will be omitted.

It will be understood that when a layer, region, or component is referred to as being "formed on" another layer, region, or component, it can be directly or indirectly formed on the other layer, region, or component, for example, intervening layers, regions, or components may be present. Sizes of components in the drawings may be exaggerated for convenience of explanation. In other words, since sizes and thicknesses of components in the drawings are arbitrarily illustrated for convenience of explanation, the following embodiments are not limited thereto.

The x, y, and z axes are not limited to three axes on the orthogonal coordinates system, and may be interpreted in a broad sense including the same. For example, the x, y, and z axes may be perpendicular to one another, or may represent different directions that are not perpendicular to one another.

FIG. 1 is a schematic perspective view of a display apparatus 1 according to some embodiments.

Referring to FIG. 1, the display apparatus 1 may include a display area DA and a peripheral area PA outside (e.g., in a periphery our outside a footprint of) the display area DA. The display area DA may display images through sub-pixels. The peripheral area PA is a non-display area which is arranged outside the display area DA and does not display images. The peripheral area PA may entirely surround the display area DA. A driver for providing electrical signals or power to the display area DA may be arranged in the peripheral area PA. A pad, which is an area to which an electronic device or a printed circuit board may be electrically connected, may be arranged in the peripheral area PA.

Hereinafter, for convenience of explanation, an embodiment where the display apparatus 1 is a smartphone is described, but the display apparatus 1 according to embodiments of the present disclosure is not limited thereto. The display apparatus 1 may be a portable electronic device, such as a mobile phone, a smartphone, a table personal computer (PC), a mobile communication terminal, an electronic notebook, an electronic book, a portable multimedia player (PMP), a navigation device, an Ultra Mobile PC (UMPC), or the like, and may also be used in various products, such as a television, a laptop computer, a monitor, an advertisement board, an Internet of things (IoT) device, or the like. In addition, the display apparatus 1 according to some embodiments may be used as a wearable device, such as a smart watch, a watch phone, a glasses-type display, and a head mounted display (HMD). The display apparatus 1 according to some embodiments may be applied to a dashboard of a vehicle, a center fascia of a vehicle or a center information display (CID) located on a dashboard, a rear mirror display replacing a side mirror of a vehicle, and a display screen located on a back surface of a front seat as entertainment for a passenger in a back seat of a vehicle.

According to some embodiments, the display area DA may include a first display area DA1, a second display area DA2, and a third display area DA3. According to some embodiments, the display area DA may not include the second display area DA2 and the third display area DA3, but hereinafter, for convenience of explanation, the display area DA is described as including the first display area DA1, the second display area DA2, and the third display area DA3.

The display area DA may display images by using sub-pixels two-dimensionally arranged therein. The sub-pixels may include first sub-pixels P1 in the first display area DA1, second sub-pixels P2 in the second display area DA2, and third sub-pixels P3 in the third display area DA3.

The first display area DA1 may occupy most of the area of the display area DA. The first display area DA1 occupying most of the area of the display area DA may indicate that the area of the first display area DA1 is about 50% or more of the area of the display area DA. The second display area DA2 may be inside the first display area DA1. For example, the second display area DA2 may be entirely surrounded by the first display area DA1. The third display area DA3 may be between the first display area DA1 and the second display area DA2. The third display area DA3 may entirely surround the second display area DA2, and may be entirely surrounded by the first display area DA1.

Each of the second display area DA2 and the third display area DA3 may have a smaller area than that of the first display area DA1. According to some embodiments, FIG. 1 illustrates that each of the second display area DA2 and the third display area DA3 has a circular shape. According to some embodiments, each of the second display area DA2 and the third display area DA3 may have a substantially rectangular shape.

Although FIG. 1 illustrates that the second display area DA2 and the third display area DA3 are at the center of the upper side (+y direction) of the display area DA having a substantially rectangular shape when viewed from a direction approximately perpendicular to the upper surface of the display apparatus 1 (e.g., in a plan view, or from a view that is normal or perpendicular to the upper surface or display surface of the display apparatus 1), embodiments according to the present disclosure are not limited thereto. The second display area DA2 and the third display area DA3 may be arranged, for example, on an upper right side or an upper left side of the display area DA.

The second display area DA2 may implement an image through the second sub-pixels P2 therein, and light or sound may be pass through an area between the second sub-pixels P2. Hereinafter, an area through which light or sound may pass is referred to an as transmission area TA. In other words, the second display area DA2 may include the transmission area TA between the second sub-pixels P2.

Figure 2:
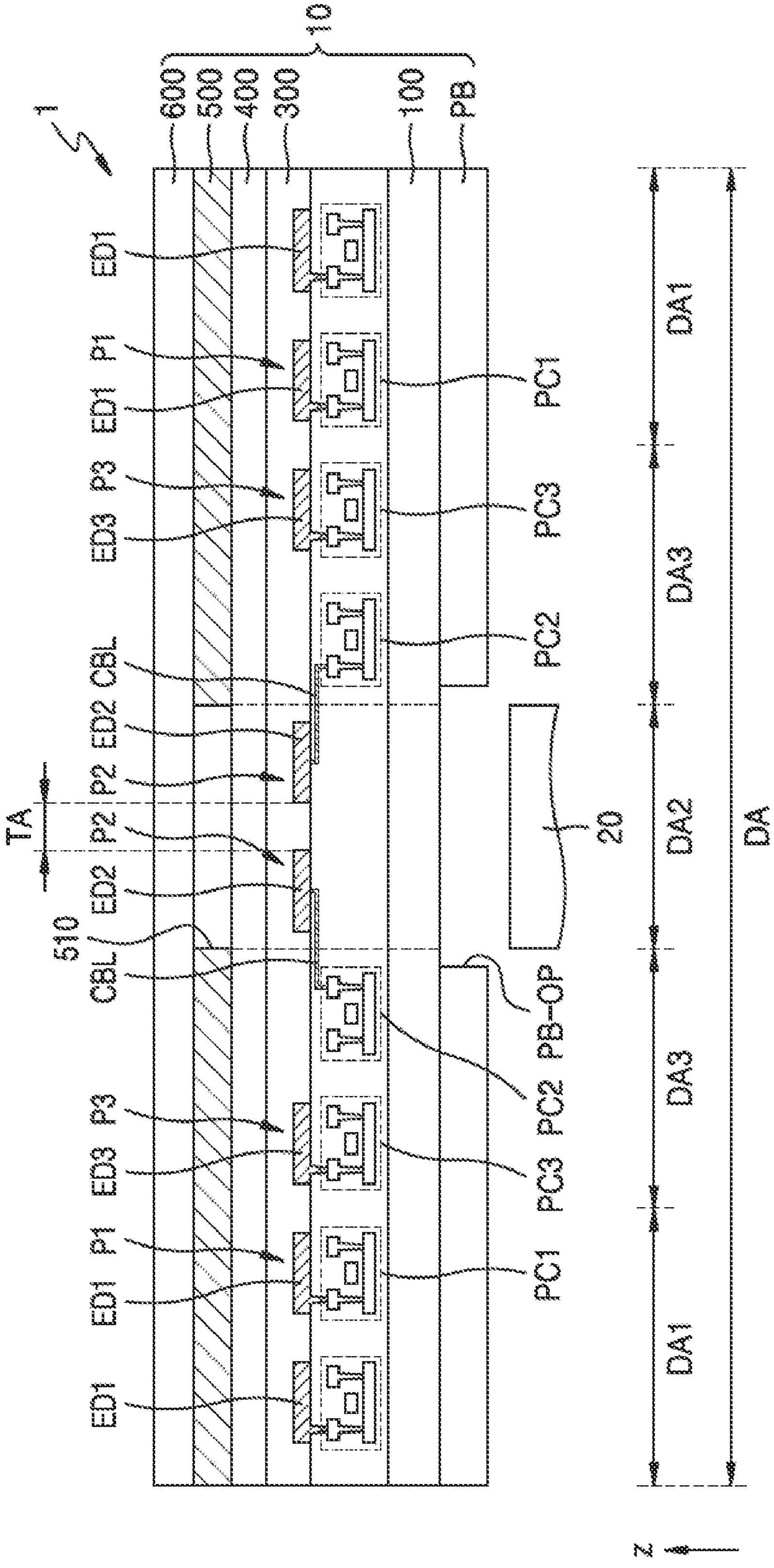
FIG. 2 is a schematic cross-sectional view of a display apparatus according to some embodiments.

FIG. 2 is a schematic cross-sectional view of the display apparatus 1 according to some embodiments.

Referring to FIG. 2, the display apparatus 1 may include a display panel 10 and a component 20 overlapping the display panel 10. The component 20 may be arranged in the second display area DA2.

The component 20 may be an electronic element using light or sound. For example, the electronic element may be a sensor that measures distance, such as a proximity sensor, a sensor that recognizes a part of a user's body (e.g., fingerprint, iris, face, or the like), a small lamp that outputs light, or an image sensor (e.g., a camera) that captures an image. An electronic element using light may use light of various wavelengths, such as visible light, infrared light, ultraviolet light, or the like. An electronic element using sound may use ultrasonic waves or sound of another frequency band.

The second display area DA2 may include the transmission area TA through which light or sound output from the component 20 to the outside or proceeding from the outside toward the component 20 may pass. According to some embodiments, the transmission area TA is an area through which light may pass, and may correspond to an area between the second sub-pixels P2. In the display apparatus 1 according to some embodiments, when light is transmitted through the second display area DA2 including the transmission area TA, the light transmittance may be about 10% or more, about 25% or more, about 40% or more, about 50% or more, about 85% or more, or about 90% or more.

Each of the first sub-pixel P1, the second sub-pixel P2, and the third sub-pixel P3 as described above with reference to FIG. 1 may emit light by using a light-emitting diode, and each light-emitting diode may be arranged in the display area DA of the display panel 10. In this regard, in the present disclosure, a light-emitting diode corresponding to the first sub-pixel P1 of the first display area DA1 may be referred to as a first light-emitting diode ED1, a light-emitting diode corresponding to the second sub-pixel P2 of the second display area DA2 may be referred to as a second light-emitting diode ED2, and a light-emitting diode corresponding to the third sub-pixel P3 of the third display area DA3 may be referred to as a third light-emitting diode ED3. Each of the first to third light-emitting diodes ED1, ED2, and ED3 may be located on a substrate 100.

The substrate 100 may include an insulating material, such as a glass material or polymer resin, and a protective film PB may be located on the rear surface of the substrate 100. The substrate 100 may be a rigid substrate, or a flexible substrate which is bendable, foldable, rollable, or the like. The protective film PB may include an opening PB-OP in the second display area DA2 to improve the transmittance of the transmission area TA.

The first light-emitting diode ED1 is in the first display area DA1, and is electrically connected to a first sub-pixel circuit PC1 in the first display area DA1. The first sub-pixel circuit PC1 may include transistors and a storage capacitor electrically connected to the transistors.

The second light-emitting diode ED2 is in the second display area DA2. The second light-emitting diode ED2 is electrically connected to a second sub-pixel circuit PC2, and the second sub-pixel circuit PC2 is not in the second display area DA2 to improve the transmittance and transmittance area of the transmission area TA provided in the second display area DA2. The second sub-pixel circuit PC2 may be in the third display area DA3, and the second light-emitting diode ED2 may be electrically connected to the second sub-pixel circuit PC2 through a conductive bus line CBL.

The conductive bus line CBL may electrically connect the second sub-pixel circuit PC2 in the third display area DA3 and the second light-emitting diode ED2 in the second display area DA2 to each other. The conductive bus line CBL may include a transparent conductive material, for example, a transparent conductive oxide (TCO). The TCO may include indium tin oxide (ITO), indium zinc oxide (IZO), zinc oxide (ZnO), indium oxide ($In_2O_3$), indium gallium oxide (IGO), and/or aluminum zinc oxide (AZO).

The third light-emitting diode ED3 is in the third display area DA3, and is electrically connected to a third sub-pixel circuit PC3 in the third display area DA3. The third sub-pixel circuit PC3 may include transistors and a storage capacitor electrically connected to the transistors.

Each of the first to third light-emitting diodes ED1, ED2, and ED3 is a light-emitting element that emits light of a certain color, and may include an organic light-emitting diode. According to some embodiments, each of the first to third light-emitting diodes ED1, ED2, and ED3 may include an inorganic light-emitting diode, or may be a light-emitting diode including quantum dots.

The first to third light-emitting diodes ED1, ED2, and ED3 may be covered by an encapsulation layer 300. The encapsulation layer 300 may be a thin-film encapsulation layer including an inorganic encapsulation layer and an organic encapsulation layer, wherein the inorganic encapsulation layer includes an inorganic insulating material, and the organic encapsulation layer includes an organic insulating material. According to some embodiments, the encapsulation layer 300 may include first and second inorganic encapsulation layers, and an organic encapsulation layer therebetween.

According to some embodiments, the encapsulation layer 300 may be an encapsulation substrate, such as glass. A sealant including a frit may be between the substrate 100 and the encapsulation substrate. The sealant may be in the peripheral area PA and extend to surround the outer edge of the display area DA to prevent or reduce instances of moisture or other contaminants penetrating toward the first to third light-emitting diodes ED1, ED2, and ED3 through the side surface of the display panel 10.

An input sensing layer 400 may be formed on the encapsulation layer 300. The input sensing layer 400 may obtain coordinate information according to an external input, for example, a touch event of an object such as a finger or a stylus pen. The input sensing layer 400 may include a touch electrode and trace lines connected to the touch electrode. The input sensing layer 400 may sense an external input in a mutual-cap method or a self-cap method.

An optical functional layer 500 may include an anti-reflection layer. The anti-reflection layer may reduce the reflectance of light incident from the outside (external light) toward the display panel 10 through a cover window 600. The anti-reflection layer may include a retarder and a polarizer. When the optical functional layer 500 includes a polarizer, the optical functional layer 500 may include an opening 510 in the second display area DA2, and thus the transmittance of the transmission area TA may be relatively improved.

According to some embodiments, the anti-reflection layer may include a black matrix and color filters. The color filters may be arranged considering the color of light emitted from each of the first to third light-emitting diodes ED1, ED2, and ED3. When the optical functional layer 500 includes a black matrix and color filters, a transparent material may be arranged at a position corresponding to the transmission area TA.

According to some embodiments, the anti-reflection layer may include a destructive interference structure. The destructive interference structure may include a first reflective layer and a second reflective layer, which are on different layers. First reflected light and second reflected light respectively reflected by the first reflective layer and the second reflective layer may destructively interfere with each other, and accordingly, the reflectance of external light may be reduced.

The cover window 600 may be located on the optical functional layer 500. The cover window 600 may be coupled to the optical functional layer 500 through an adhesive layer, such as a transparent optically clear adhesive. The cover window 600 may include glass material or a plastic material. The plastic material may include polyethersulfone, polyacrylate, polyetherimide, polyethylene naphthalate, polyethylene terephthalate, polyphenylene sulfide, polyarylate, polyimide, polycarbonate, cellulose acetate propionate, or the like.

The cover window 600 may include a flexible cover window. For example, the cover window 600 may include polyimide and/or ultra-thin glass.

Figure 3:
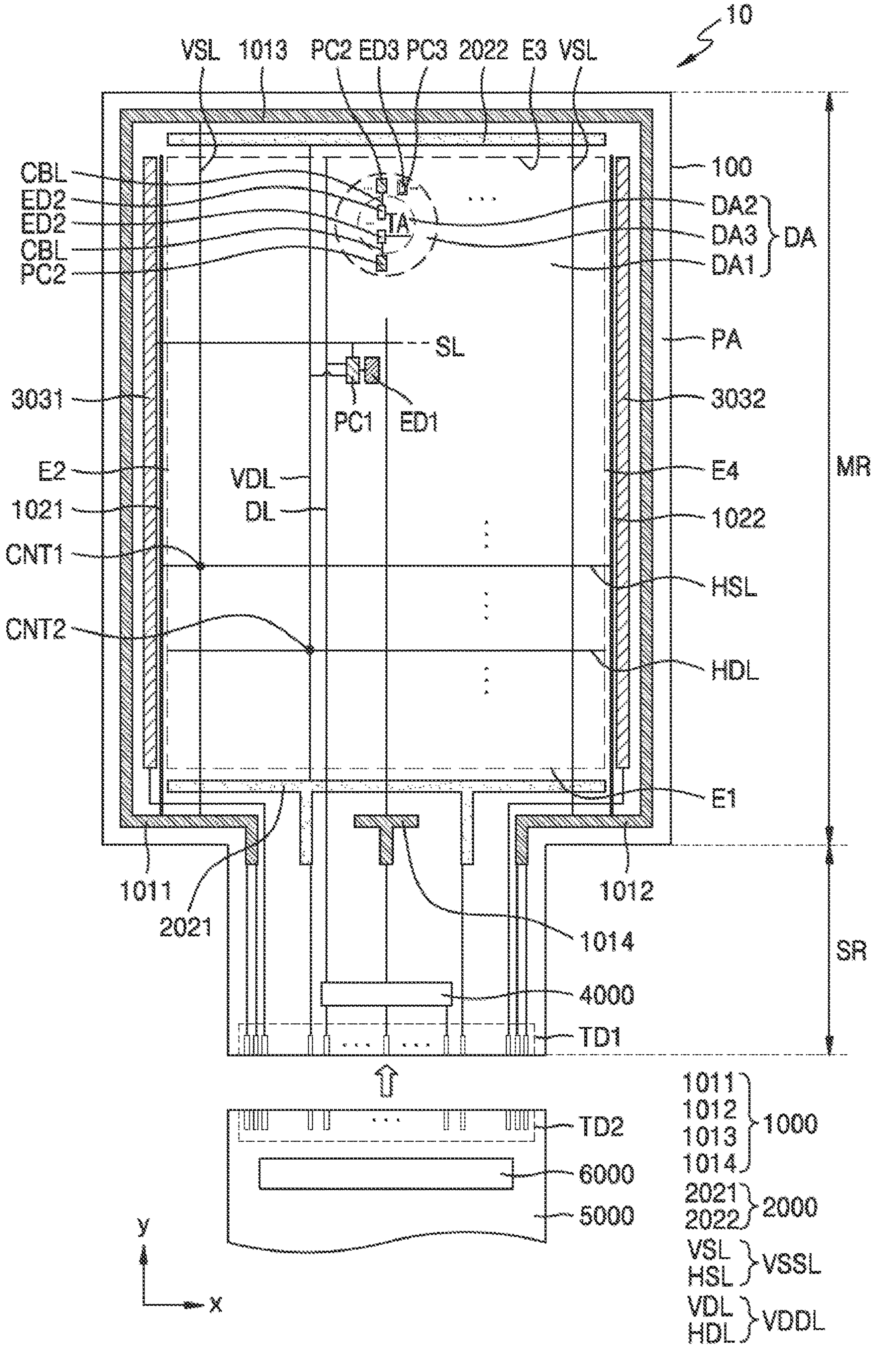
FIG. 3 is a schematic plan view of a display panel according to some embodiments.

FIG. 3 is a schematic plan view of the display panel 10 according to some embodiments.

Referring to FIG. 3, the display panel 10 may include the display area DA and the peripheral area PA. The shape of the display panel 10 may substantially the same as the shape of the substrate 100. For example, the substrate 100 may include the display area DA and the peripheral area PA.

According to some embodiments, the display area DA may include the first to third display areas DA1, DA2, and DA3. The display area DA, for example, the first to third display areas DA1, DA2, and DA3, may correspond to an image surface of the display panel 10. The second display area DA2 may be surrounded by the third display area DA3, and the third display area DA3 may be surrounded by the first display area DA1. The second display area DA2 may include the transmission area TA as described above with reference to FIG. 2.

The display area DA is a portion that displays images, and the display area DA may have various shapes, for example, a circular shape, an oval shape, a polygonal shape, or a shape of a particular figure. FIG. 1 shows that the display area DA has a substantially rectangular shape, but according to some embodiments, the display area DA may have a substantially rectangular shape with rounded corners, or any other suitable shape.

Light-emitting diodes may be in the display area DA. The light-emitting diodes may be respectively electrically connected to sub-pixel circuits in the display area DA. In some embodiments, light-emitting diodes are in the first to third display areas DA1, DA2, and DA3, and sub-pixel circuits respectively electrically connected to the light-emitting diodes may be in the first display area DA1 and the third display area DA3, but may not be in the second display area DA2.

For example, the first sub-pixel circuit PC1 electrically connected to the first light-emitting diode ED1 in the first display area DA1 may be in the first display area DA1, and the second and third sub-pixel circuits PC2 and PC3 respectively electrically connected to the second and third light-emitting diodes ED2 and ED3 in the second display area DA2 and the third display area DA3 may be in the third display area DA3. In other words, some of the sub-pixel circuits (e.g., the second sub-pixel circuit PC2) in the third display area DA3 may be electrically connected to the second light-emitting diode ED2 in the second display area DA2, and some other of sub-pixel circuits (e.g., the third sub-pixel circuit PC3) in the third display area DA3 may be electrically connected to the third light-emitting diode ED3 in the third display area DA3. Hereinafter, for convenience of explanation, the sub-pixel circuits electrically connected to the second light-emitting diodes ED2 among the sub-pixel circuits in the third display area DA3 are referred to as the second sub-pixel circuits PC2, and the sub-pixel circuits electrically connected to the third light-emitting diodes ED3 among the sub-pixel circuits in the third display area DA3 are referred to as the third sub-pixel circuits PC3.

FIG. 3 shows that the second sub-pixel circuits PC2 are in the third display area DA3, but the disclosure is not limited thereto. According to some embodiments, the second sub-pixel circuits PC2 may be in the peripheral area PA.

The first to third sub-pixel circuits PC1, PC2, and PC3 may include transistors connected to signal lines or voltage lines for controlling on/off and brightness of the first to third light-emitting diodes ED1, ED2, and ED3 respectively corresponding to the first to third sub-pixel circuits PC1, PC2, and PC3. In this regard, FIG. 3 shows a scan line SL and a data line DL as data lines electrically connected to the transistors, and shows a driving voltage line VDDL and a common voltage VSSL as voltage lines.

The peripheral area PA may entirely surround the display area DA. A portion of the peripheral area PA (hereafter, referred to as a read peripheral area) may extend in a direction away from the display area DA. In other words, the display panel 10 may include a display area DA, a main area MR including a portion of the peripheral area PA surrounding the display area DA, and a sub-area SR extending in a direction from the main area MR, and the sub-area SR may correspond to the peripheral area described above. The width of the sub-area SR (e.g., a width in an x direction) may be less than the width of the main area MR (e.g., a width in the x direction), and a portion of the sub-area SR may be bent toward the rear surface of the substrate 100.

Voltage supply lines and driving circuits may be in the peripheral area PA. In this regard, FIG. 3 shows that a common voltage supply line 1000, a driving voltage supply line 2000, a first driving circuit 3031, a second driving circuit 3032, and a data driving circuit 4000 are in the peripheral area PA.

The common voltage supply line 1000 may have a loop shape partially surrounding the display area DA and having one side open. The common voltage supply line 1000 may include a first common voltage input unit 1011 and a second common voltage input unit 1012, and a third common voltage input unit 1014, which are arranged adjacent to a first edge E1 of the display area DA. According to some embodiments, the first common voltage input unit 1011 and the second common voltage input unit 1012 may be adjacent to the first edge E1 of the display area DA, but may be spaced apart from each other. The third common voltage input unit 1014 may be adjacent to the first edge E1 of the display area DA, and may be between the first common voltage input unit 1011 and the second common voltage input unit 1012.

The first common voltage input unit 1011 and the second common voltage input unit 1012 may each be connected to a body portion 1013 extending along a second edge E2, a third edge E3, and a fourth edge E4 of the display area DA. In other words, the first common voltage input unit 1011, the second common voltage input unit 1012, and the body portion 1013 may be integrally formed. The common voltage supply line 1000 has a loop shape with one side open, and two end portions of the common voltage supply line 1000 may respectively correspond to the first common voltage input unit 1011 and the second common voltage input unit 1012, and an area between the first common voltage input unit 1011 and the second common voltage input unit 1012 may correspond to the body portion 1013.

A first auxiliary common voltage supply line 1021 and a second auxiliary common voltage supply line 1022 may be in the peripheral area PA. Each of the first auxiliary common voltage supply line 1021 and the second auxiliary common voltage supply line 1022 may be a kind of branch line extending from the common voltage supply line 1000.

The first auxiliary common voltage supply line 1021 may be electrically connected to the common voltage supply line 1000, and may extend along the second edge E2 of the display area DA. The first auxiliary common voltage supply line 1021 may be between the first driving circuit 3031 to be described below and the second edge E2 of the display area DA.

The second auxiliary common voltage supply line 1022 may be electrically connected to the common voltage supply line 1000, and may extend along the fourth edge E4 of the display area DA. The second auxiliary common voltage supply line 1022 may be between the second driving circuit 3032 to be described below and the fourth edge E4 of the display area DA. The common voltage supply line 1000, the first auxiliary common voltage supply line 1021, and the second auxiliary common voltage supply line 1022 may be electrically connected to the common voltage lines VSSL passing through the display area DA.

The common voltage lines VSSL may include a first common voltage line and a second common voltage line, which extend to cross each other. For example, the common voltage line VSSL may include the first common voltage line extending in a y direction and a second common voltage line extending in an x direction. Hereinafter, for convenience of explanation, 'the first common voltage line extending in the y direction' is referred to as a vertical common voltage line VSL, and 'the second common voltage line extending in the x direction' is referred to as a horizontal common voltage line HSL.

The vertical common voltage line VSL and the horizontal common voltage line HSL may pass through the display area DA to cross each other. The vertical common voltage line VSL and the horizontal common voltage line HSL may be on different layers.

The vertical common voltage line VSL may be electrically connected to the common voltage supply line 1000. One end portion of each of the vertical common voltage lines VSL may be connected to the body portion 1013, and the other end portion of each of the vertical common voltage lines VSL may be connected to the first common voltage input unit 1011, the second common voltage input unit 1012, or the third common voltage input unit 1014.

The horizontal common voltage line HSL may electrically connect the first auxiliary common voltage supply line 1021 and the second auxiliary common voltage supply line 1022 to each other. One end portion of each of the horizontal common voltage lines HSL may be electrically connected to the first auxiliary common voltage supply line 1021, and the other end portion of each of the horizontal common voltage lines HSL may be electrically connected to the second auxiliary common voltage supply line 1022.

In some embodiments, the vertical common voltage line VSL and the horizontal common voltage line HSL may be electrically connected to each other through a first contact hole CNT1 defined in at least one insulating layer therebetween. The first contact hole CNT1 for the connection of the vertical common voltage line VSL and the horizontal common voltage line HSL may be in the display area DA. For example, the first contact hole CNT1 for the connection of the vertical common voltage line VSL and the horizontal common voltage line HSL may be in a portion of the display area DA, the portion being between the first edge E1 of the display area DA and the transmission area TA.

The driving voltage supply line 2000 may include a first driving voltage input unit 2021 and a second driving voltage input unit 2022, which are spaced apart from each other with the display area DA therebetween. The first driving voltage input unit 2021 and the second driving voltage input unit 2022 may extend substantially in parallel with each other with the display area DA therebetween. The first driving voltage input unit 2021 may be adjacent to the first edge E1 of the display area DA, and the second driving voltage input unit 2022 may be adjacent to the third edge E3 of the display area DA.

The driving voltage supply line 2000 may be electrically connected to the driving voltage line VDDL passing through the display area DA. The driving voltage line VDDL may include a first driving voltage line and a second driving voltage line, which extend to cross each other. For example, the driving voltage line VDDL may include a first driving voltage line extending in the y direction and a second driving voltage line extending in the x direction. Hereinafter, for convenience of explanation, 'the first driving voltage line extending in the y direction' is referred to as a vertical driving voltage line VDL, and 'the second driving voltage line extending in the x direction' is referred to as a horizontal driving voltage line HDL.

The vertical driving voltage line VDL and the horizontal driving voltage line HDL may pass through the display area DA to cross each other. The vertical driving voltage line VDL and the horizontal driving voltage line HDL may be on different layers, and may be connected through a second contact hole CNT2 formed in at least one insulating layer therebetween. The second contact hole CNT2 for the connection between the vertical driving voltage line VDL and the horizontal driving voltage line HDL may be in the display area DA.

The first driving circuit 3031 and the second driving circuit 3032 and each be in the peripheral area PA and be electrically connected to the scan line SL. According to some embodiments, some of the scan lines SL may be electrically connected to the first driving circuit 3031, and some other of the scan lines SL maybe connected to the second driving circuit 3032. The first driving circuit 3031 and the second driving circuit 3032 may each include a scan driver that generates a scan signal, and the generated scan signal may be transmitted to any one transistor of a sub-pixel circuit, for example, a first sub-pixel circuit PC1.

The data driving circuit 4000 may transmit a data signal to any one transistor of a sub-pixel circuit, for example, each of the first to third sub-pixel circuits PC1, PC2, and PC3, through a data line DL passing through the display area DA.

A first terminal portion TD1 may be on one side of the substrate 100. A printed circuit board 5000 may be attached to the first terminal portion TD1. The printed circuit board 5000 may include a second terminal portion TD2 electrically connected to the first terminal portion TD1, and a controller 6000 may be located on the printed circuit board 5000. Control signals of the controller 6000 may be provided to each of the first and second driving circuits 3031 and 3032, the data driving circuit 4000, the driving voltage supply line 2000, and the common voltage supply line 1000 through the first and second terminal portions TD1 and TD2.

Figure 4:
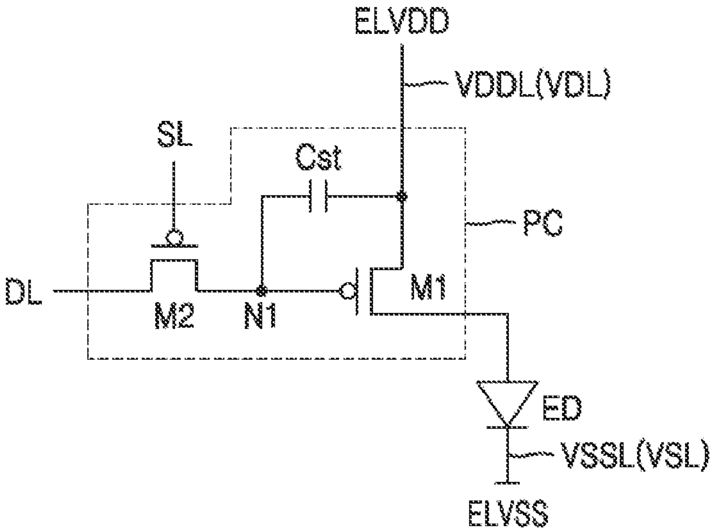
FIG. 4 is an equivalent circuit diagram schematically illustrating a sub-pixel circuit electrically connected to a light-emitting diode of a display panel according to some embodiments.

FIG. 4 is an equivalent circuit diagram schematically illustrating a sub-pixel circuit electrically connected to a light-emitting diode of a display panel according to some embodiments. A light-emitting diode ED of FIG. 4 may correspond to each of the first to third light-emitting diodes ED1, ED2, and ED3 described above with reference to FIG. 3, and a sub-pixel circuit PC of FIG. 4 may correspond to each of the first to third sub-pixel circuits PC1, PC2, and PC3 described above with reference to FIG. 3. In other words, an equivalent circuit diagram of the first light-emitting diode ED1 (refer to FIG. 3) and the first sub-pixel circuit PC1, an equivalent circuit diagram of the second light-emitting diode ED2 (refer to FIG. 3) and the second sub-pixel circuit PC2, and an equivalent diagram of the third light-emitting diode ED3 (refer to FIG. 3) and the third sub-pixel circuit PC3 may be the same as each other. As described above, the light-emitting diode ED may be an organic light-emitting diode or an inorganic light-emitting diode, or may include a quantum dot light-emitting diode.

Referring to FIG. 4, the light-emitting diode ED, for example, a first electrode (e.g., an anode) of the light-emitting diode ED may be electrically connected to the sub-pixel circuit PC, and a second electrode (e.g., a cathode) of the light-emitting diode ED may be electrically connected to the common voltage line VSSL (e.g., the vertical common voltage line VSL) providing a common voltage ELVSS. The light-emitting diode ED may emit light with a brightness corresponding to a current amount supplied from the sub-pixel circuit PC.

The sub-pixel circuit PC may control the amount of current flowing from the driving voltage line VDDL to the common voltage ELVSS via the light-emitting diode ED in response to a data signal. The sub-pixel circuit PC may include a first transistor M1, a second transistor M2, and a storage capacitor Cst.

Each of the first transistor M1 and the second transistor M2 may be an oxide semiconductor transistor including a semiconductor layer including an oxide semiconductor, or a silicon semiconductor transistor including a semiconductor layer including polysilicon. Depending on the type of transistor, the first electrode may be one of a source electrode and a drain electrode, and the second electrode may be the other one of the source electrode and the drain electrode.

A first electrode of the first transistor M1 may be connected to the driving voltage line VDDL (e.g., the vertical driving voltage line VDL) supplying a driving voltage ELVDD, and a second electrode thereof may be connected to the first electrode of the light-emitting diode ED. A gate electrode of the first transistor M1 may be connected to a first node N1. The first transistor M1 may control an amount of current flowing through the light-emitting diode ED from the driving voltage line VDDL, for example, the vertical driving voltage line VDL, in response to a voltage of the first node N1.

The second transistor M2 may be a switching transistor. A first electrode of the second transistor M2 may be connected to the data line DL, and a second electrode thereof may be connected to the first node N1. A gate electrode of the second transistor M2 may be connected to the scan line SL. The second transistor M2 may be turned on when a scan signal is supplied to the scan line SL to electrically connect the data line DL and the first node N1 to each other.

The storage capacitor Cst may be connected to the first node N1. For example, a first capacitor electrode of the storage capacitor Cst may be connected to the gate electrode of the first transistor M1, and a second capacitor electrode of the storage capacitor Cst may be electrically connected to the driving voltage line VDDL, for example, the vertical driving voltage line VDL. In some embodiments, the second capacitor electrode of the storage capacitor Cst may be a portion of the driving voltage line VDDL, for example, a portion of the horizontal driving voltage line HDL described above with reference to FIG. 3.

FIG. 4 shows two transistors, but embodiments according to the present disclosure are not limited thereto. The sub-pixel circuit PC may include three or more transistors.

Figure 5:
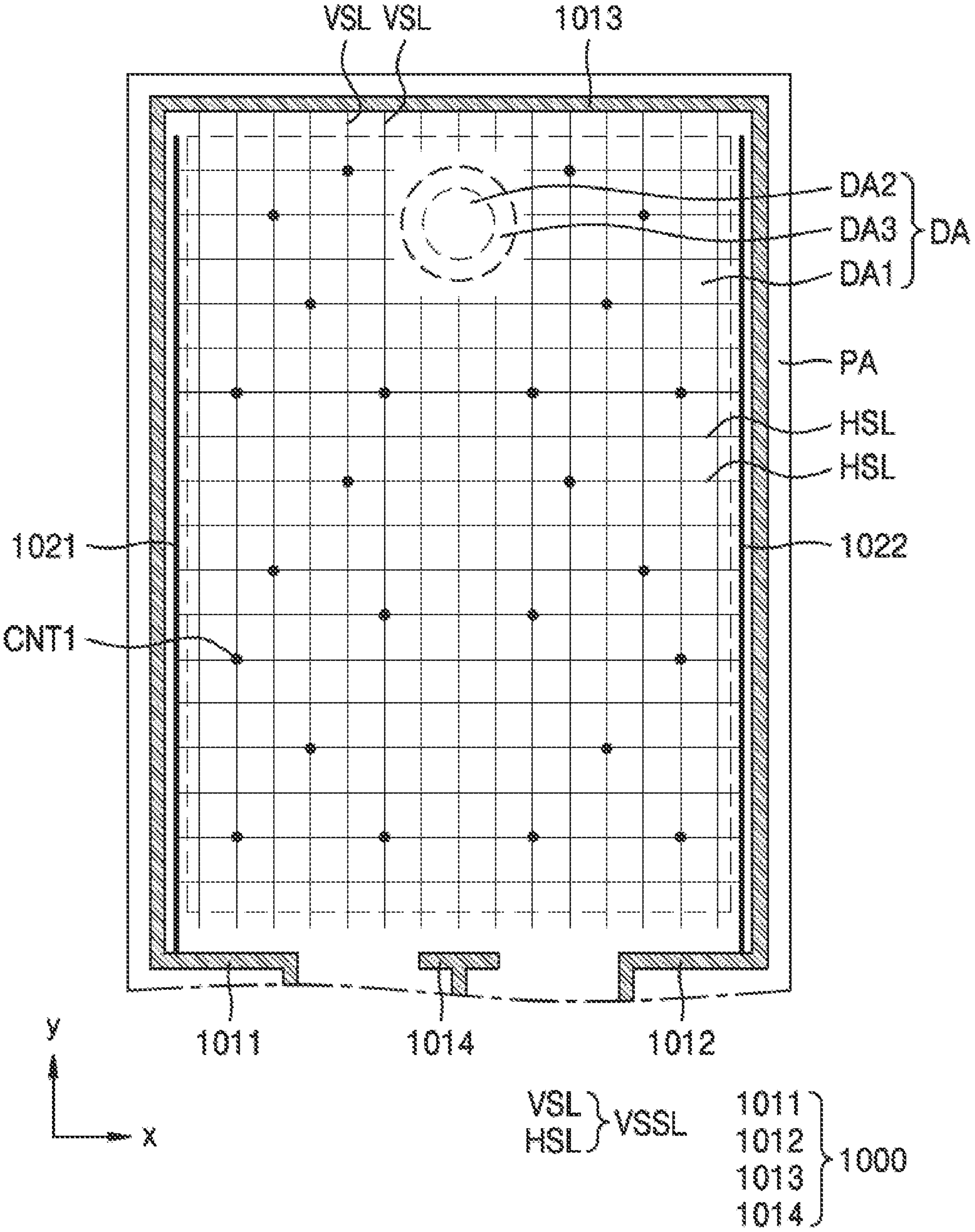
FIG. 5 is a plan view illustrating a horizontal common voltage line and a vertical common voltage line of a display panel, according to some embodiments.

FIG. 5 is a plan view illustrating a horizontal common voltage line and a vertical common voltage line of a display panel, according to some embodiments.

Referring to FIG. 5, the common voltage supply line 1000, and the first auxiliary common voltage supply line 1021 and the second auxiliary common voltage supply line 1022, which are electrically connected to the common voltage supply line 1000, may be in the peripheral area PA.

The common voltage line VSSL electrically connected to the common voltage supply line 1000 may be in the display area DA. The common voltage line VSSL may be electrically connected to a second electrode (e.g., a cathode) of a light-emitting diode. The common voltage line VSSL may include the vertical common voltage lines VSL and the horizontal common voltage lines HSL, which cross each other. The vertical common voltage lines VSL extending in a first direction (e.g., a y direction) and the horizontal common voltage lines HSL extending in a second direction (e.g., an x direction) to respectively cross the vertical common voltage lines VSL may be in the display area DA. Some of the vertical common voltage lines VSL may be electrically connected to the first common voltage input unit 1011 and the body portion 1013, some other of the vertical common voltage lines VSL may be electrically connected to the second common voltage input unit 1012 and the body portion 1013, and some other of the vertical common voltage lines VSL may be electrically connected to the third common voltage input unit 1014 and the body portion 1013.

The vertical common voltage lines VSL and the horizontal common voltage lines HSL crossing each other may have a mesh structure in a plan view. The vertical common voltage line VSL and the horizontal common voltage line HSL on different layers may be electrically connected to each other in the display area DA. For example, the vertical common voltage line VSL and the horizontal common voltage line HSL may be electrically connected to each other through the first contact hole CNT1 defined in at least one insulating layer between the vertical common voltage line VSL and the horizontal common voltage line HSL.

In some embodiments, when the display area DA includes the second display area DA2, the vertical common voltage line VSL and the horizontal common voltage line HSL may not pass through the second display area DA2 to sufficiently secure the transmission area TA (refer to FIG. 3) in the second display area DA2.

Figure 6:
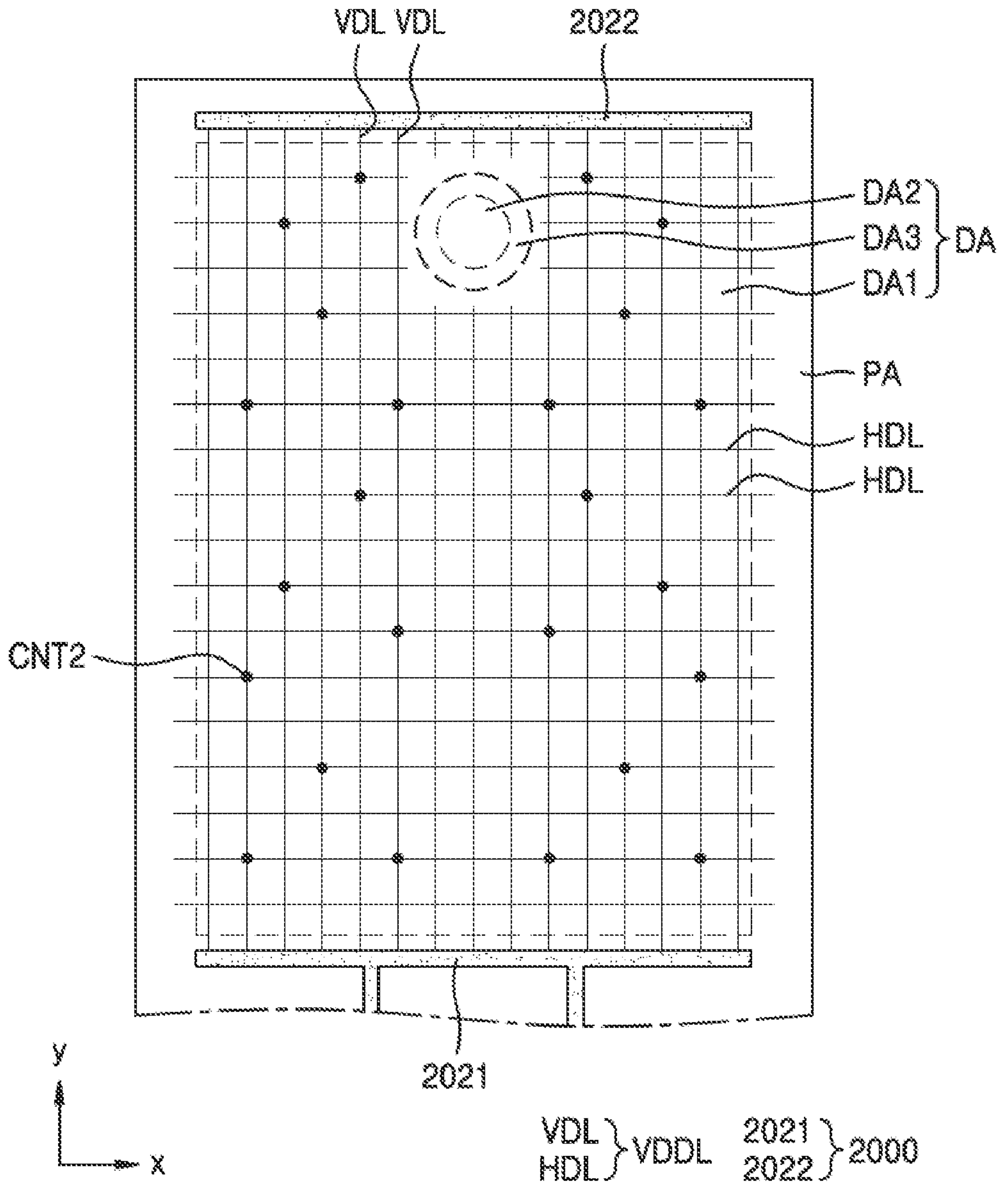
FIG. 6 is a plan view illustrating a horizontal driving voltage line and a vertical driving voltage line of a display panel, according to some embodiments.

FIG. 6 is a plan view illustrating a horizontal driving voltage line and a vertical driving voltage line of a display panel, according to some embodiments.

Referring to FIG. 6, as described above, the driving voltage supply line 2000 is in the peripheral area PA, and the driving voltage supply line 2000 may include the first driving voltage input unit 2021 and the second driving voltage input unit 2022, which are spaced apart from each other with the display area DA therebetween.

The driving voltage line VDDL electrically connected to the driving voltage supply line 2000 may be in the display area DA. The driving voltage line VDDL may include the vertical driving voltage line VDL and the horizontal driving voltage line HDL, which cross each other. The vertical driving voltage lines VDL extending in the first direction (e.g., the y direction) and the horizontal driving voltage lines HDL extending in the second direction (e.g., the x direction) to cross the vertical driving voltage lines VDL may be in the display area DA. The vertical driving voltage lines VDL and the horizontal driving voltage lines HDL crossing each other may have a mesh structure in a plan view.

The horizontal driving voltage line HDL may include the second capacitor electrode of the storage capacitor Cst described above with reference to FIG. 4. In other words, a portion of the horizontal driving voltage line HDL may correspond to the second capacitor electrode of the storage capacitor Cst.

The vertical driving voltage line VDL and the horizontal driving voltage line HDL on different layers may be electrically connected to each other in the display area DA. For example, the vertical driving voltage line VDL and the horizontal driving voltage line HDL may be electrically connected to each other through the second contact hole CNT2 defined in at least one insulating layer between the vertical driving voltage line VDL and the horizontal driving voltage line HDL.

In some embodiments, when the display area DA includes the second display area DA2, the vertical driving voltage line VDL and the horizontal driving voltage line HDL may not pass through the second display area DA2 to sufficiently secure the transmission area TA (refer to FIG. 3) in the second display area DA2.

Figure 7A:
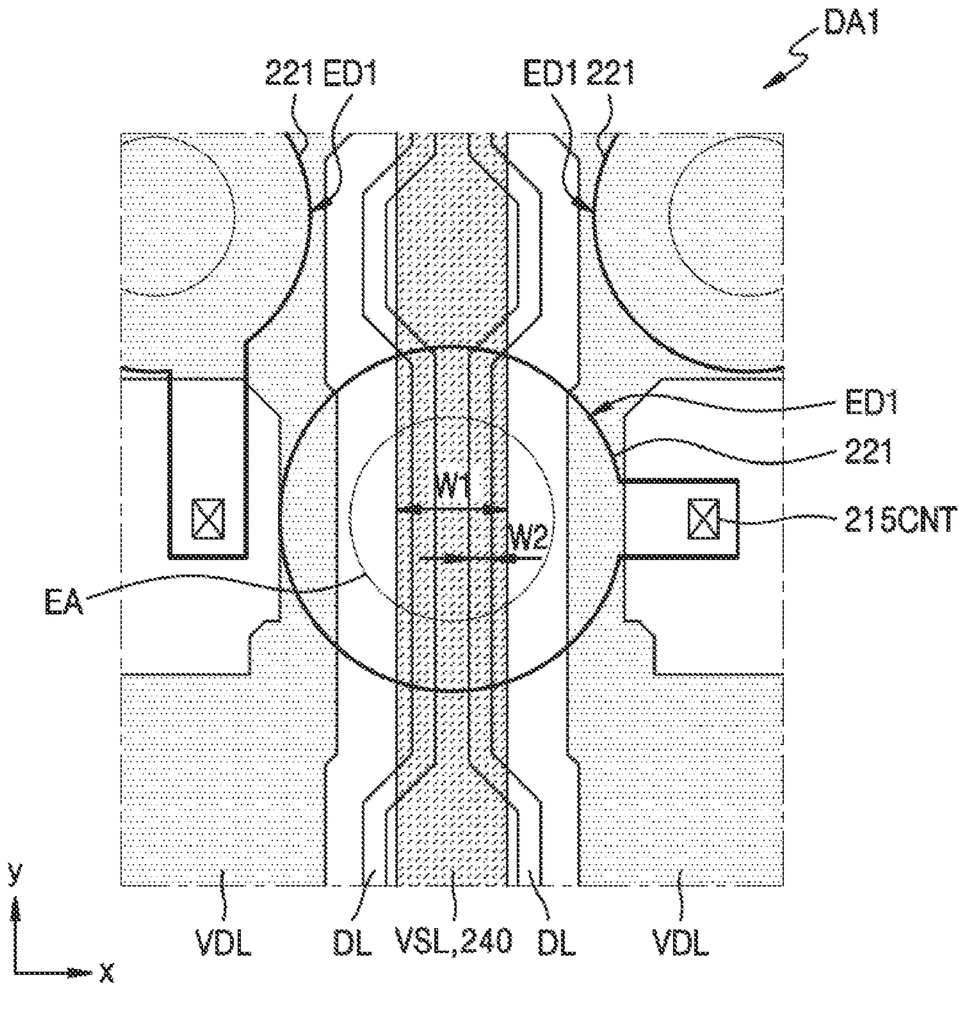
FIGS. 7A and 7B are plan views each illustrating a portion of a display panel according to some embodiments.
Figure 7B:
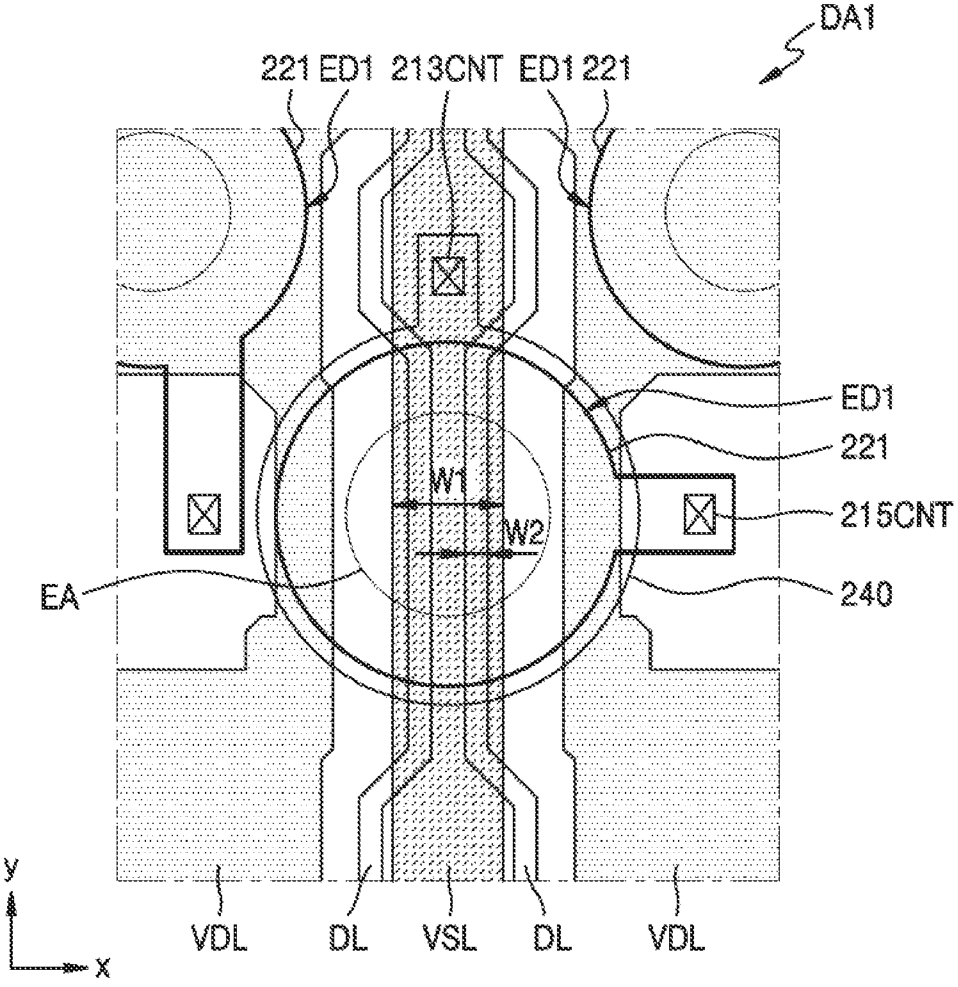

FIGS. 7A and 7B are plan views each illustrating a portion of a display panel according to some embodiments. FIGS. 7A and 7B show a portion of a display area of the display panel, for example, the first display area DA1.

Referring to FIGS. 7A and 7B, the data line DL may extend in a first direction (e.g., a y direction). The vertical driving voltage line VDL may be arranged adjacent to the data line DL and extend in the first direction (e.g., y direction). The data line DL and the vertical driving voltage line VDL, which are arranged adjacent to each other, may each be electrically connected to any one sub-pixel circuit, and supply a data signal or a driving voltage.

In some embodiments, FIGS. 7A and 7B show that two data lines DL are arranged adjacent to each other, and two vertical driving voltage lines VDL are arranged at opposite sides with the two data lines DL therebetween. In other words, FIGS. 7A and 7B show that the two data lines DL and the two vertical driving voltage lines VDL are respectively arranged symmetrically in a horizontal direction with respect to a virtual vertical line extending in a first direction (e.g., a y direction) between the two data lines DL.

According to some embodiments, the two data lines DL and the two vertical driving voltage lines VDL may not be horizontally symmetrical with respect to the virtual vertical line described above. For example, the vertical driving voltage line VDL and the data line DL may be alternately arranged in the second direction (e.g., the x direction). In other words, the two data lines DL may be spaced apart from each other with the vertical driving voltage line VDL therebetween.

A voltage layer 240 may overlap the data line DL. For example, the voltage layer 240 may extend in the first direction (e.g., the y direction), like the data line DL. The voltage layer 240 may have a voltage level of ab electrostatic voltage. For example, the voltage layer 240 may have the same voltage level as that of the common voltage line VSSL (refer to FIG. 5) described with reference FIG. 5. In some embodiments, the voltage layer 240 may be electrically connected to a sub-layer of the common voltage line VSSL (refer to FIG. 5), for example, any one of the vertical and horizontal common voltage lines VSL and HSL respectively corresponding to the first and second common voltage lines.

According to some embodiments, the voltage layer 240 may be a portion of the vertical common voltage line VSL having a voltage level of a common voltage, as shown in FIG. 7A. The vertical common voltage line VSL may overlap a first electrode 221 of the first light-emitting diode ED1 while overlapping the data line DL.

According to some embodiments, the voltage layer 240 may be on a layer different from the vertical common voltage line VSL having a voltage level of the common voltage, as shown in FIG. 7B. The vertical common voltage line VSL and the voltage layer 240, which are on different layers, may be electrically connected to each other through a contact hole 213CNT defined in an insulating layer therebetween. The voltage layer 240 as shown in FIG. 7B may be located on the vertical common voltage line VSL with an insulating layer therebetween.

The voltage layer 240 may include a conductive material. The voltage layer 240 may include a transparent conductive oxide, such as ITO, IZO, ZnO, $In_2O_3$, IGO, and/or AZO.

A first width W1 of the voltage layer 240 may be greater than a second width W2 of the data line DL. In some embodiments, as shown in FIGS. 7A and 7B, the first width W1 of the voltage layer 240 may be greater than a sum of the second widths W2 of two data lines DL. The first width W1 of the voltage layer 240 may be less than a width of the first electrode 221 of the first light-emitting diode ED1, as shown in FIG. 7A. According to some embodiments, the first width W1 of the voltage layer 240 may be relatively large enough to overlap most of the first electrode 221 of the first light-emitting diode ED1, as shown in FIG. 7B.

The voltage layer 240 may overlap a light-emitting diode, for example, an emission area EA of the first light-emitting diode ED1. The voltage layer 240 may overlap a portion of the emission area EA of the first light-emitting diode ED1 as shown in FIG. 7A, or may entirely overlap the emission area EA of the first light-emitting diode ED1 as shown in FIG. 7B.

Referring to FIGS. 7A and 7B, light-emitting diodes, for example, the first light-emitting diodes ED1, may be spaced apart from each other. Any one first light-emitting diode ED1 among the first light-emitting diodes ED1 may overlap the voltage layer 240 and the data line DL, and the other one first light-emitting diode ED1 may overlap the vertical driving voltage line VDL.

The first electrode 221 of any one first light-emitting diode ED1 may overlap the data line DL below the voltage layer 240. As a comparative example of the disclosure, when there is no voltage layer 240, the first light-emitting diode ED1 overlapping the data line DL may emit light with a brightness different from that of the other first light-emitting diode ED1 due to parasitic capacitance between the data line DL and the first electrode 221. In this case, the display quality of a display apparatus may be reduced. However, when the voltage layer 240 is arranged as in the above-described embodiments, the problem described above may be prevented or reduced.

The other first light-emitting diode ED1 may overlap the vertical driving voltage line VDL. According to some embodiments, the vertical driving voltage line VDL may include a narrow width portion having a relatively small width and a wide width portion having a relatively large width in the second direction (e.g., the x direction), and the other first light-emitting diode ED1 may overlap the wide width portion of the vertical driving voltage line VDL.

Figure 8A:
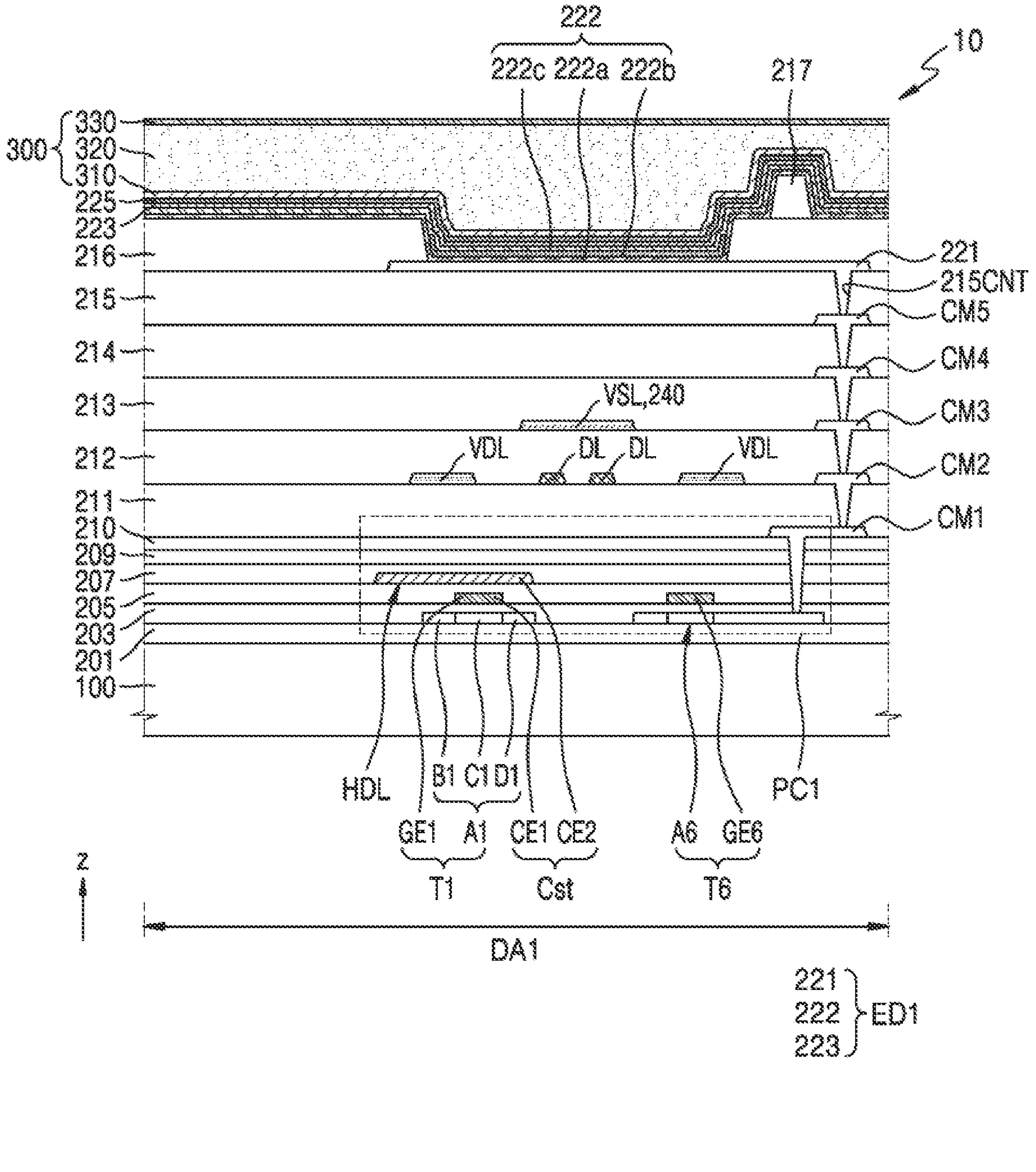
FIGS. 8A and 8B are cross-sectional views each illustrating a portion of a display panel according to some embodiments.
Figure 8B:
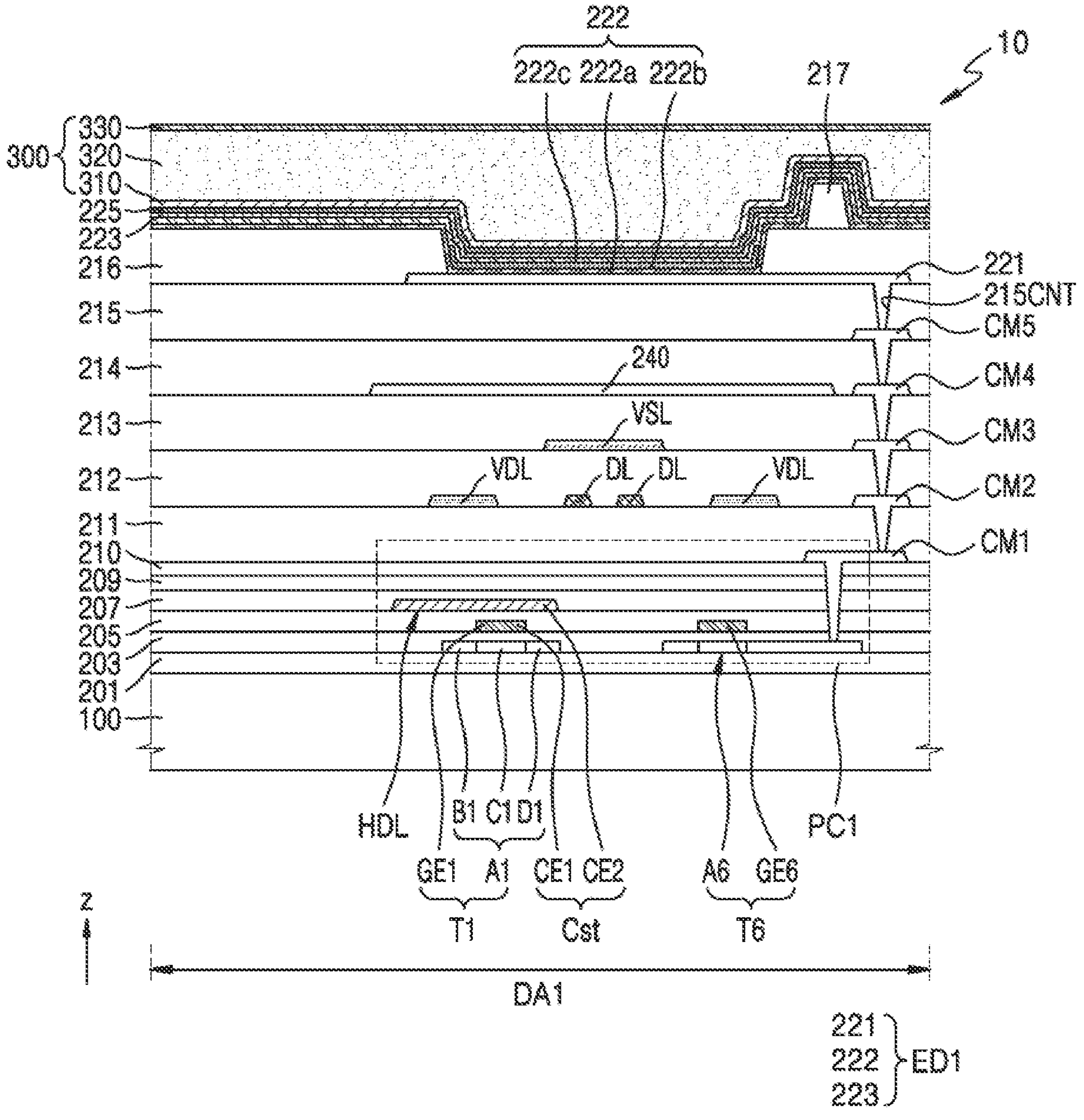

FIGS. 8A and 8B are cross-sectional views each illustrating a portion of a display panel according to some embodiments.

Referring to FIGS. 8A and 8B, in the first display area DA1, the first sub-pixel circuit PC1 may be located on the substrate 100, and the first light-emitting diode ED1 may be located above the first sub-pixel circuit PC1 to be electrically connected to the first sub-pixel circuit PC1. The substrate 100 may include a glass material or a polymer resin.

A buffer layer 201 may be located on an upper surface of the substrate 100. The buffer layer 201 may prevent or reduce instances of contaminants or impurities penetrating into a semiconductor layer of a transistor. The buffer layer 201 may include an inorganic insulating material such as silicon nitride, silicon oxynitride, and silicon oxide, and may include a single layer or a multi-layer, each including the inorganic insulating material stated above.

The first sub-pixel circuit PC1 may be located on the buffer layer 201. The first sub-pixel circuit PC1 may include a plurality of transistors and a storage capacitor as described above with reference to FIG. 4, and FIG. 8 shows a first transistor T1 and the storage capacitor Cst of the first sub-pixel circuit PC1. In some embodiments, the first sub-pixel circuit PC1 may further include a transistor in addition to the transistors described with reference to FIG. 4. In this regard, FIG. 8 shows that the first sub-pixel circuit PC1 includes an additional transistor (hereinafter, referred to as a sixth transistor T6) electrically connected between the first transistor T1 and the first electrode 221 of the first light-emitting diode ED1.

The first transistor T1 may include a first semiconductor layer A1 on the buffer layer 201, and a first gate electrode GE1 overlapping a channel area C1 of the first semiconductor layer A1. The first semiconductor layer A1 may include a silicon semiconductor material, for example, polysilicon, or an oxide semiconductor material. The first semiconductor layer A1 may include the channel area C1, a first area B1, and a second area D1, wherein the first area B1 and the second area D1 are respectively arranged on both sides of the channel area C1. The first area B1 and the second area D1 are areas having higher conductivities than that of the channel area C1, and any one of the first area B1 and the second area D1 may be a source area, and the other one may correspond to a drain area.

The sixth transistor T6 may include a sixth semiconductor layer A6 on the buffer layer 201, and a sixth gate electrode GE6 overlapping the sixth semiconductor layer A6. The sixth semiconductor layer A6 may include the same material as that of the first semiconductor layer A1, and may be integrally connected to the first semiconductor layer A1. The sixth semiconductor layer A6 may include a channel area, a source area, and a drain area, wherein the source area and the drain area are respectively on both sides of the channel area.

The first gate electrode GE1 and the sixth gate electrode GE6 may each include a conductive material, such as molybdenum (Mo), aluminum (Al), copper (Cu), titanium (Ti), or the like, and may include a single layer or a multi-layer, each including the above material. A first gate insulating layer 203 for electrical insulation between the first semiconductor layer A1 and the sixth semiconductor layer A6 may be located below the first gate electrode GE1 and the sixth gate electrode GE6. The first gate insulating layer 203 may include an inorganic insulating material, such as silicon nitride, silicon oxynitride, and silicon oxide, and may include a single layer or a multi-layer, each including the inorganic insulating material stated above.

The storage capacitor Cst may include a first capacitor electrode CE1 and a second capacitor electrode CE2, which overlap each other. According to some embodiments, the first capacitor electrode CE1 may include the first gate electrode GE1. In other words, the first gate electrode GE1 may include the first capacitor electrode CE1. For example, the first gate electrode GE1 and the first capacitor electrode CE1 may be an integral body.

A first interlayer insulating layer 205 may be between the first capacitor electrode CE1 and the second capacitor electrode CE2 of the storage capacitor Cst. The first interlayer insulating layer 205 may include an inorganic insulating material, such as silicon oxide, silicon nitride, and silicon oxynitride, and may include a single layer or a multi-layer, each including the inorganic insulating material stated above.

In some embodiments, the second capacitor electrode CE2 may be a portion of the horizontal driving voltage lines HDL. A portion of the horizontal driving voltage lines HDL, the portion overlapping the first capacitor electrode CE1, may correspond to the second capacitor electrode CE2.

The horizontal driving voltage line HDL and the second capacitor electrode CE2 may each include a low-resistance conductive material, such as Mo, Al, Cu, and/or Ti, and may include a single layer or a multi-layer, each including the above material.

A second interlayer insulating layer 207, a third interlayer insulating layer 209, and a fourth interlayer insulating layer 210 may be located above the storage capacitor Cst. Each of the second interlayer insulating layer 207, the third interlayer insulating layer 209, and the fourth interlayer insulating layer 210 may include an inorganic insulating material, such as silicon oxide, silicon nitride, and silicon oxynitride, and may include a single layer or a multi-layer, each including the above inorganic insulating material.

A first insulating layer 211 may be located on the fourth interlayer insulating layer 210. The first insulating layer 211 may include an inorganic insulating material or an organic insulating material. According to some embodiments, the first insulating layer 211 may include an organic insulating material, such as acrylic, benzocyclobutene (BCB), polyimide, or hexamethyldisiloxane (HMDSO).

The data line DL and the vertical driving voltage line VDL may be located on the first insulating layer 211, and may include the same material. The data line DL and the vertical driving voltage line VDL may each include A1, Cu, and/or Ti, and may include a single layer or a multi-layer, each including the above material. For example, the data line DL and the vertical driving voltage line VDL may each have a three-layer structure of titanium layer/aluminum layer/titanium layer.

According to some embodiments, as described above with reference to FIG. 7A, when the voltage layer 240 corresponds to a portion of the vertical common voltage line VSL, the voltage layer 240 may be located above the data line DL with a second insulating layer 212 therebetween, as shown in FIG. 8A. The voltage layer 240 may overlap the data line DL while having a greater width than the width of the data line DL. The voltage layer 240 may include a transparent conductive oxide.

According to some embodiments, as described above with reference to FIG. 7B, the voltage layer 240 may be on a layer different from that of the vertical common voltage line VSL. In this regard, FIG. 8B shows that the vertical common voltage line VSL is located on the second insulating layer 212, and the voltage layer 240 is located on a third insulating layer 213. According to some embodiments, the voltage layer 240 may be electrically connected to the vertical common voltage line VSL through the contact hole 213CNT (refer to FIG. 7B) defined in the third insulating layer 213.

According to some embodiments, the voltage layer 240 may be electrically connected to a horizontal common voltage line. The voltage layer 240 may overlap the data line DL while having a greater width than the width of the data line DL. The voltage layer 240 may include a transparent conductive oxide.

Referring to FIGS. 8A and 8B, the voltage layer 240 may overlap the first electrode 221 of the first light-emitting diode ED1 with insulating layer(s) therebetween. FIG. 8A shows that the voltage layer 240 is located on the second insulating layer 212, and FIG. 8B shows that the voltage layer 240 is located on the third insulating layer 213, but the disclosure is not limited thereto. According to some embodiments, the voltage layer 240 may be located on a fourth insulating layer 214.

Each of the second insulating layer 212, the third insulating layer 213, the fourth insulating layer 214, and a fifth insulating layer 215 may include an organic insulating material, such as acrylic, BCB, polyimide, or HMDSO.

The first electrode 221 of the first light-emitting diode ED1 may be located on the fifth insulating layer 215. The first electrode 221 may be electrically connected to the sixth transistor T6 through first to fifth connection metal CM1, CM2, CM3, CM4, and CM5. The first connection metal CM1 and/or the second connection metal CM2 may include a metal material. For example, the first connection metal CM1 and/or the second connection metal CM2 may include the same material as the material of the data line DL and/or a driving voltage line (for example, the vertical driving voltage VDL). Each of the third connection metal CM3, the fourth connection metal CM4, and the fifth connection metal CM5 may include a transparent conductive material. The third connection metal CM3 may include the same material as the material of the voltage layer 240.

The first electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to some embodiments, the first electrode 221 may include a conductive oxide layer above and/or below the reflective film described above. The conductive oxide layer may include ITO, IZO, ZnO, $In_2O_3$, IGO, and/or AZO. According to some embodiments, the first electrode 221 may include a plurality of sub-layers. For example, the first electrode 221 may have a three-layer structure of ITO layer/Ag layer/ITO layer.

A bank layer 216 may be located on the first electrode 221. The bank layer 216 may include an opening overlapping the first electrode 221, and the width of the opening of the bank layer 215 may correspond to the width of an emission area of the first light-emitting diode ED1.

The bank layer 216 may cover the edge of the first electrode 221. The bank layer 216 may overlap a contact hole 215CNT of the fifth insulating layer 215 formed for electrical connection of the first sub-pixel circuit PC1 and the first electrode 221. The bank layer 216 may include an organic insulating material, such as polyimide. Alternatively, the bank layer 2216 may include a light-blocking material. According to some embodiments, the bank layer 216 may include an organic insulating material including a light-blocking dye.

A spacer 217 may be formed on the bank layer 216. The spacer 217 and the bank layer 216 may be formed together in the same process, or may be individually formed in separate processes. According to some embodiments, the spacer 217 may include an organic insulating material, such as polyimide. According to some embodiments, the bank layer 216 may include an organic insulating material including a light-blocking die, and the spacer 217 may include an organic insulating material, such as polyimide.

An intermediate layer 222 may include an emission layer 222*b*. The intermediate layer 222 may include a first functional layer 222*a* located below the emission layer 222*b* and/or a second functional layer 222*c* located on the emission layer 222*b*. The emission layer 222*b* may include a polymer organic material or a low-molecular-weight organic material, which emits light of a certain color (red, green, or blue). According to some embodiments, the emission layer 222*b* may include an inorganic material or quantum dots.

The second functional layer 222*c* may include an electron transport layer (ETL) and/or an electron injection layer (EIL). The first functional layer 222*a* and the second functional layer 222*c* may each include an organic material.

The emission layer 222*b* may be formed in the first display area DA1 to overlap the first electrode 221 through the opening of the bank layer 216. On the contrary, organic material layers in the intermediate layer 222, for example, the first functional layer 222*a* and the second functional layer 222*c*, may entirely cover the display area DA (refer to FIG. 3).

The intermediate layer 222 may have a single stacked structure including a single emission layer, or a tandem structure. The tandem structure may include a plurality of stacks each including an emission layer. The tandem structure may include a charge generation layer (CGL) between the plurality of stacks.

A second electrode 223 may include a conductive material having a low work function. For example, the second electrode 223 may include a (semi)transparent layer including Ag, Mg, Al, Pt, Pd, Au, Ni, Nd, Ir, Cr, lithium (Li), calcium (Ca), alloys thereof, or the like. Alternatively, the second electrode 223 may further include a layer, such as ITO, IZO, ZnO, or $In_2O_3$, above the (semi)transparent layer including the material stated above. The second electrode 223 may entirely cover the display area DA (refer to FIG. 3).

A capping layer 225 may be located on the second electrode 223. The capping layer 225 may include an inorganic material or an organic material. The capping layer 225 may include lithium fluoride (LiF), an inorganic insulating material, and/or an organic insulating material. The capping layer 225 may entirely cover the display area DA.

The first light-emitting diode ED1 may be covered with the encapsulation layer 300. The encapsulation layer 300 may include at least one organic encapsulation layer and at least one inorganic encapsulation layer. According to some embodiments, FIGS. 8A and 8B show that the encapsulation layer 300 includes first and second inorganic encapsulation layers 310 and 330, and an organic encapsulation layer 320 between the first and second inorganic encapsulation layers 310 and 330. The encapsulation layer 300 may be located on the capping layer 225.

The first inorganic encapsulation layer 310 and the second inorganic encapsulation layer 330 may each include at least one inorganic material from among aluminum oxide, titanium oxide, tantalum oxide, hafnium oxide, zinc oxide, silicon oxide, silicon nitride, or silicon oxynitride. The first inorganic encapsulation layer 310 and the second inorganic encapsulation layer 330 may be a single layer or a multilayer, each including the material stated above. The organic encapsulation layer 320 may include a polymer material. The polymer material may include an acrylic resin, an epoxy resin, polyimide, polyethylene, or the like. According to some embodiments, the organic encapsulation layer 320 may include acrylate.

Figure 9:
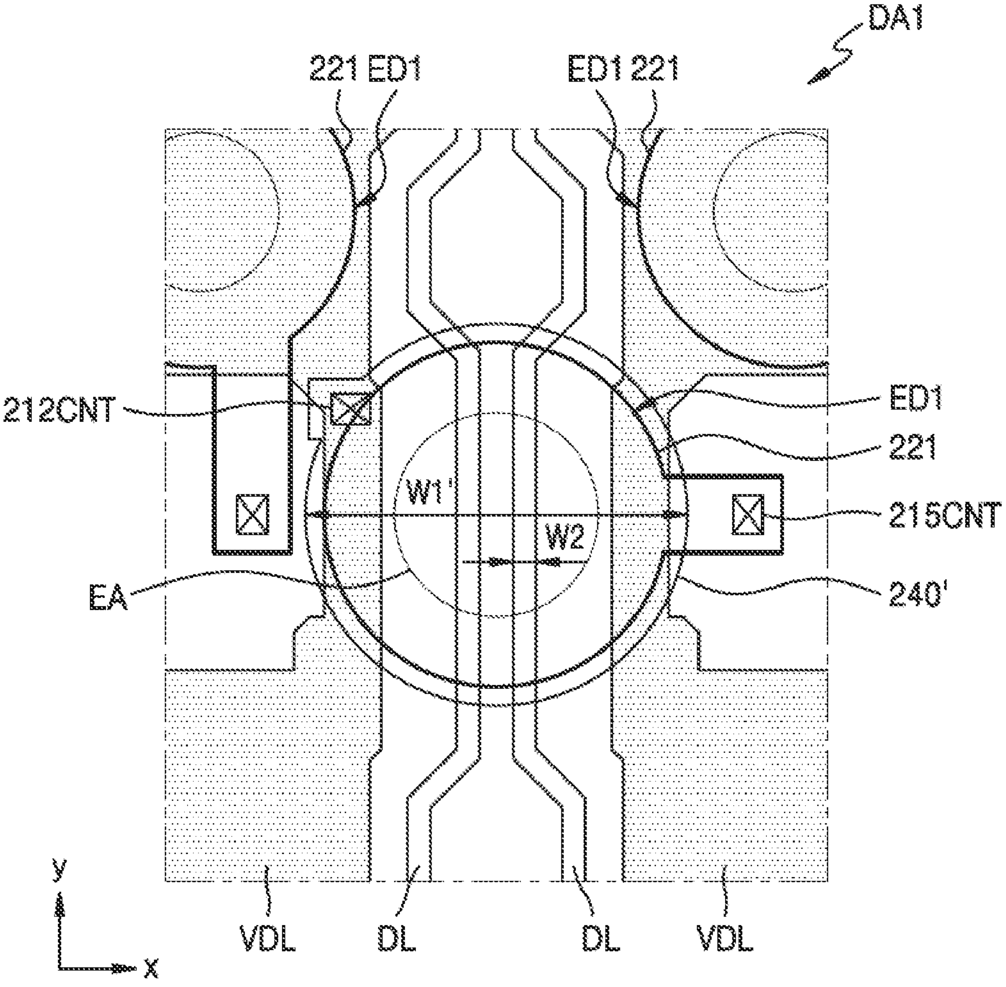
FIG. 9 is a plan view illustrating a portion of a display panel according to some embodiments.

FIG. 9 is a plan view illustrating a portion of a display panel according to some embodiments. FIG. 9 shows a portion of a display area of a display panel, for example, the first display area DA1.

Referring to FIG. 9, the data line DL may extend in a first direction (e.g., a y direction). The vertical driving voltage line VDL may be arranged adjacent to the data line DL and extend in the first direction (e.g., y direction). The data line DL and the vertical driving voltage line VDL, which are arranged adjacent to each other, may each be electrically connected to any one sub-pixel circuit, and supply a data signal or a driving voltage.

In some embodiments, FIG. 9 shows that tow data lines DL are arranged adjacent to each other, and two vertical driving voltage lines VDL are respectively arranged on opposite sides with the two data lines DL therebetween, as described above with reference to FIG. 7A. According to some embodiments, the two data lines DL and the two vertical driving voltage lines VDL may not be horizontally symmetrical with respect to the virtual vertical line described above. For example, the vertical driving voltage line VDL and the data line DL may be alternately arranged in the second direction (e.g., the x direction).

Light-emitting diodes, for example, the first light-emitting diodes ED1, may be arranged to be spaced apart from each other. Any one first light-emitting diode ED1 of the first light-emitting diodes ED1 may overlap the data line DL. In some embodiments, as shown in FIG. 9, when a plurality of data lines DL are arranged adjacent to each other, the first light-emitting diode ED1 and/or the first electrode 221 of the first light-emitting diode ED1 may respectively overlap the data lines DL. According to some embodiments, when the data lines DL are arranged to be spaced apart from each other with the vertical driving voltage line VDL therebetween, the first light-emitting diode ED1 may overlap one data line DL.

A voltage layer 240' may overlap the data line DL. For example, the voltage layer 240' may have a shape similar to the shape of the first electrode 221 of the first light-emitting diode ED1 overlapping the data line DL. For example, the voltage layer 240' may have an isolated shape in a plan view. An edge of the voltage layer 240' may be arranged farther from the center of the first electrode 221 of the first light-emitting diode ED1 than an edge of the first electrode 221 of the first light-emitting diode ED1.

The voltage layer 240' may have a voltage level of an electrostatic voltage. According to some embodiments, the voltage layer 240' may have a voltage level of a driving voltage.

In some embodiments, the voltage layer 240' may be electrically connect to a sub-layer of the driving voltage line VDDL (refer to FIG. 6), for example, any one of the vertical and horizontal driving voltage lines VDL and HDL respectively corresponding to the first and second driving voltage lines. For example, as shown in FIG. 9, the voltage layer 240' may be electrically connected to the vertical driving voltage line VDL through a contact hole 212CNT defined in an insulating layer between the voltage layer 240' and the vertical driving voltage line VDL.

The voltage layer 240' may include a conductive material. The voltage layer 240' may include a transparent conductive oxide, such as ITO, IZO, ZnO, $In_2O_3$, IGO, and/or AZO.

A first width W1' of the voltage layer 240' may be greater than the second width W2 of the data line DL. In some embodiments, as shown in FIG. 9, the first width W1' of the voltage layer 240' may be greater than a sum of the second widths W2 of two data lines DL.

Light-emitting diodes, for example, the first light-emitting diodes ED1, may be arranged to be spaced apart from each other. Any one first light-emitting diode ED1 among the first light-emitting diodes ED1 may overlap the voltage layer 240' and the data line DL, and the other one first light-emitting diode ED1 may overlap the vertical driving voltage line VDL. The other first light-emitting diode ED1 may overlap the vertical driving voltage line VDL. According to some embodiments, the vertical driving voltage line VDL may include a narrow width portion having a relatively small width and a wide width portion having a relatively large width in the second direction (e.g., the x direction), and the other first light-emitting diode ED1 may overlap the wide width portion of the vertical driving voltage line VDL.

Figure 10:
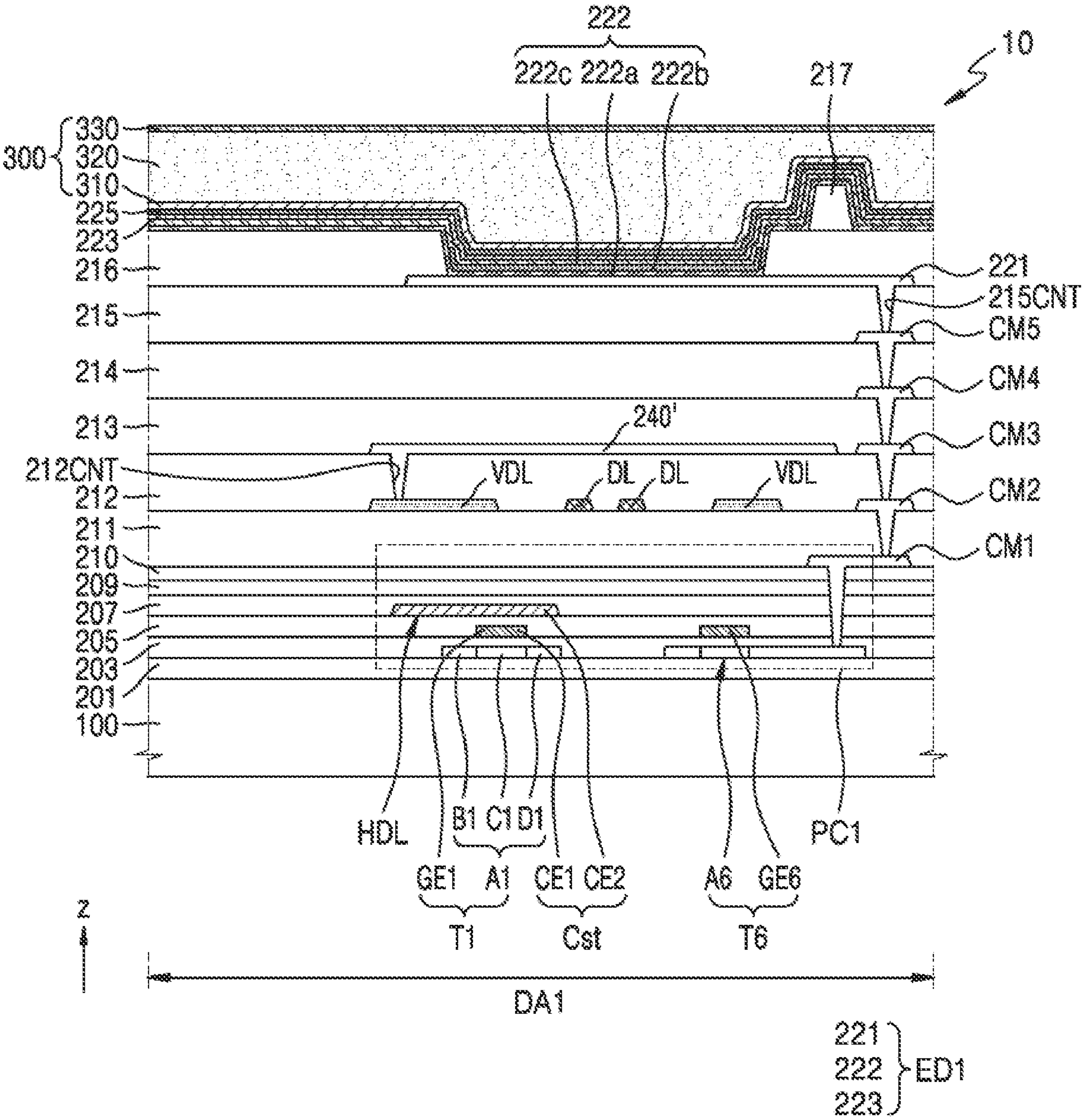
FIG. 10 is a cross-sectional view illustrating a portion of a display panel according to some embodiments.

FIG. 10 is a cross-sectional view illustrating a portion of a display panel according to some embodiments.

The display panel 10 according to some embodiments of FIG. 10 may have a structure substantially the same as the structure of the display panel 10 described above with reference to FIG. 8A or 8B, except for the voltage layer 240'. For example, in the first display area DA1, the first sub-pixel circuit PC1 may be located on the substrate 100, and the first light-emitting diode ED1 may be electrically connected to the first sub-pixel circuit PC1 and sealed by the encapsulation layer 300. Among the configurations of the display panel 10 of FIG. 10, a structure that is the same as that of the display panel 10 described above with reference to FIGS. 8A and 8B is replaced with the above description, and hereinafter, differences thereof are mainly described.

The voltage layer 240' may be located on the second insulating layer 212. The voltage layer 240' and the vertical driving voltage line VDL may be on different layers with the second insulating layer 212 therebetween. The voltage layer 240' may be electrically connected to the vertical driving voltage line VDL through a contact hole 212CNT of the second insulating layer 212, and may have the same voltage level as that of the vertical driving voltage line VDL.

According to some embodiments, the vertical driving voltage line VDL may be electrically connected to the horizontal driving voltage line HDL as described above with reference to FIG. 6. In some embodiments, the vertical driving voltage line VDL and the horizontal driving voltage line HDL may be electrically connected to each other through a second contact hole penetrating through an insulating layer (e.g., the second interlayer insulating layer 207, the third interlayer insulating layer 209, the fourth interlayer insulating layer 210, and the first insulating layer 211) therebetween.

The voltage layer 240' may be located on the data line DL. As described above with reference to FIG. 8, the voltage layer 240' may overlap the data line DL while having a greater width than the width of the data line DL. The voltage layer 240' may include a transparent conductive oxide. The voltage layer 240' may overlap the first electrode 221 of the first light-emitting diode ED1 with insulating layers, for example, the third insulating layer 213, the fourth insulating layer 214, and the fifth insulating layer 215, therebetween.

FIG. 10 shows that the voltage layer 240' is located on the second insulating layer 212, but the disclosure is not limited thereto. According to some embodiments, the voltage layer 240' may be located on the third insulating layer 213, or may be located on the fourth insulating layer 214.

Figure 11:
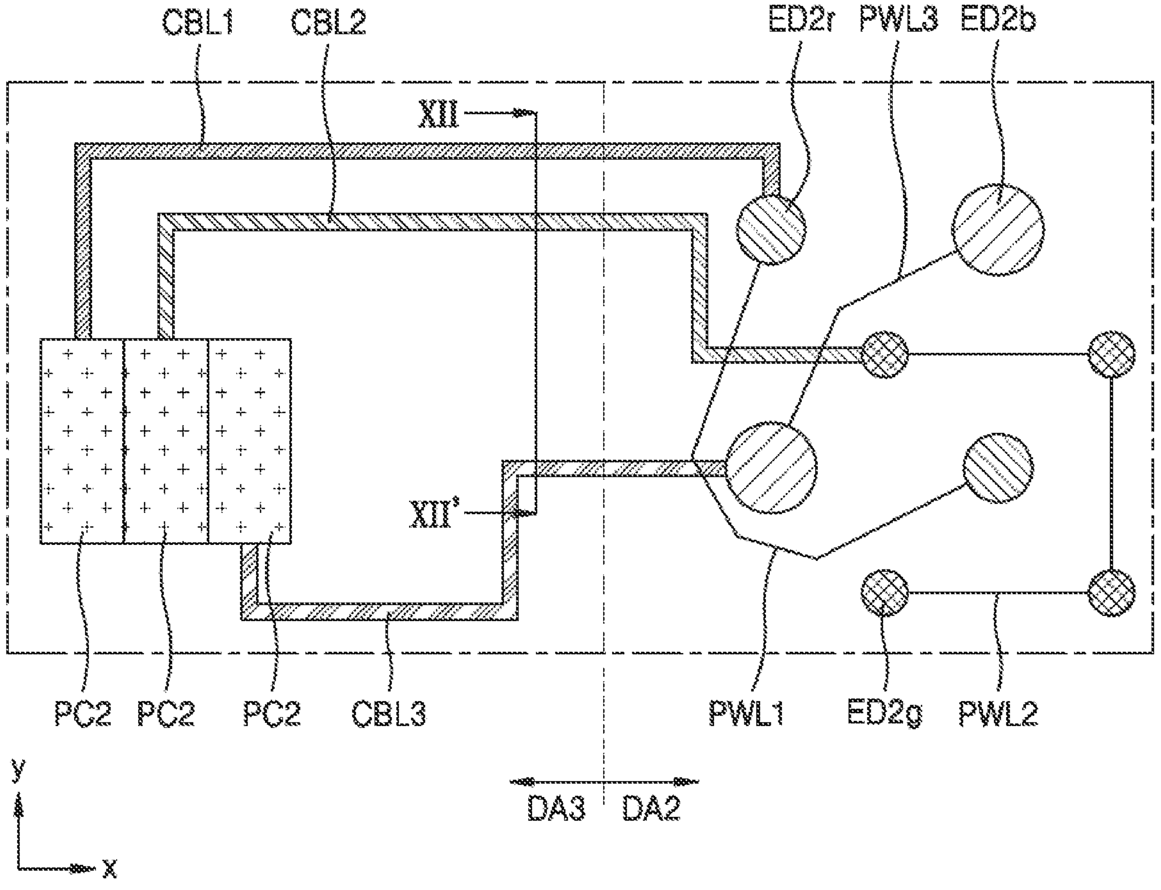
FIG. 11 is a plan view of a portion of a display panel illustrating second light-emitting diodes electrically connected to second sub-pixel circuits through conductive bus lines, according to some embodiments.
Figure 12:
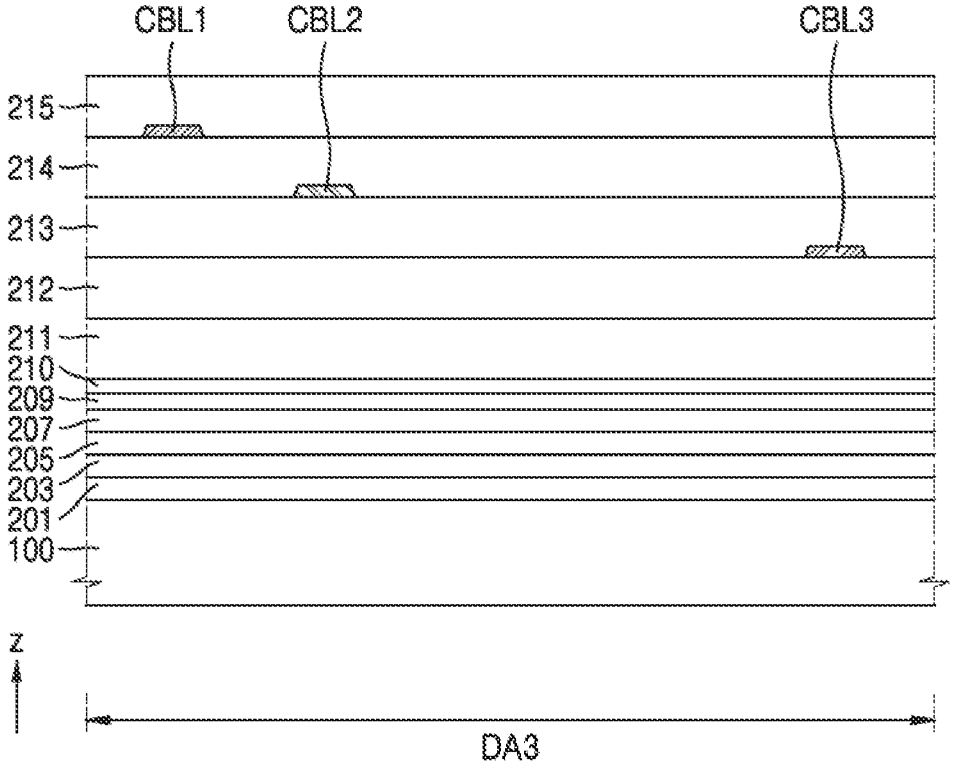
FIG. 12 is a cross-sectional view taken along a line XII-XII' of FIG. 11 according to some embodiments.

FIG. 11 is a plan view of a portion of a display panel according to some embodiments, illustrating that second light-emitting diodes are electrically connected to second sub-pixel circuits through conductive bus lines, and FIG. 12 is a cross-sectional view taken along a line XII-XII' of FIG. 11.

Each second sub-pixel circuit PC2 in the third display area DA3 may be electrically connected to a plurality second light-emitting diodes emitting light of the same color. In this regard, FIG. 11 shows that one second sub-pixel circuit PC2 is electrically connected to two second red light-emitting diodes ED2*r* through a first conductive bus line CBL1, the other one second sub-pixel circuit PC2 is electrically connected to four second green light-emitting diodes Ed2*g* through a second conductive bus line CBL2, and the other second sub-pixel circuit PC2 is electrically connected to two second blue light-emitting diodes Ed2*b* through a third conductive bus line CBL3.

The first conductive bus line CBL1 may extend from the third display area DA3 toward the second display area DA2. A portion of the first conductive bus line CBL1 may be electrically connected to the second sub-pixel circuit PC2, and the other portion of the first conductive bus line CBL1 may be electrically connected to any one of the two second red light-emitting diodes ED2*r*. One of the two second red light-emitting diodes ED2*r*, which is connected to the first conductive bus line CBL1, may be connected to the other one second red light-emitting diode ED2 through a first connection line PWL1.

A second conductive bus line CBL2 may extend from the third display area DA3 toward the second display area DA2. A portion of the second conductive bus line CBL2 may be electrically connected to the second sub-pixel circuit PC2, and the other portion of the second conductive bus line CBL2 may be electrically connected to any one of the four second green light-emitting diodes ED2*g*. One of the four second green light-emitting diodes ED2*g*, which is connected to the second conductive bus line CBL2, may be connected to the other one second green light-emitting diode ED2*g* via a second connection line PWL2.

A third conductive bus line CBL3 may extend from the third display area DA3 toward the second display area DA2. A portion of the third conductive bus line CBL3 may be electrically connected to the second sub-pixel circuit PC2, and the other portion of the third conductive bus line CBL3 may be electrically connected to any one of the two second blue light-emitting diodes ED2*b*. One second blue light-emitting diode ED2*b* among the second blue light-emitting diodes ED2*b*, which is connected to the third conductive bus line CBL3, may be connected to the other one second blue light-emitting diode ED2*b* through a third connection line PWL3.

Referring to FIGS. 11 and 12, at least one of the first to third conductive bus lines CBL1, CBL2, or CBL3 may be formed together in the same process as the voltage layers 240 and 240' described above with reference to FIGS. 8A, 8B, and 10. At least one of the first to third conductive bus lines CBL1, CBL2, or CBL3 may be located on the same layer as that of the voltage layers 240 and 240'. According to some embodiments, FIG. 12 shows that the first to third conductive bus lines CBL1, CBL2, and CBL3 are respectively located on the fourth insulating layer 214, the third insulating layer 213, and the second insulating layer 212.

At least one of the first to third conductive bus lines CBL1, CBL2, or CBL3 may include the same material as the material of the voltage layer 240 and 240', for example, a transparent conductive material. For example, the first to third conductive bus lines CBL1, CBL2, and CBL3 may each include a transparent conductive oxide (TCO). The TCO may include a conductive oxide, such as ITO, IZO, Zno, $In_2O_3$, IGO, IZGO, or AZO.

The first to third connection lines PWL1, PWL2, and PW3 may each have transmission properties. For example, the first to third connection lines PWL1, PWL2, and PW3 may each include a TCO. In some embodiments, the first to third connection lines PWL1, PWL2, and PW3 may include the same material as the material in the first electrode 221 (refer to FIGS. 8A, 8B, and 10) of a light-emitting diode. In some embodiments, when the first electrode 221 includes a sub-layer including ITO and a sub-layer including Ag, the first to third connection lines PWL1, PWL2, and PW3 may be integrally formed with the sub-layer including ITO of the first electrode 221.

According to some embodiments as described above, reductions in display quality of images due to a light-emitting diode and a data line located therebelow may be prevented or reduced by using a voltage layer, and thus, a display apparatus capable of providing high-quality images may be provided. The scope of embodiments according to the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:

a sub-pixel circuit in a display area and comprising a plurality of transistors;

a first data line electrically connected to one of the plurality of transistors of the sub-pixel circuit and extending in a first direction in the display area;

a second data line extending in the first direction in the display area;

a voltage layer extending in the first direction and having a width greater than a width of the first data line and the second data line and overlapping the first data line and the second data line; and a light-emitting diode comprising a first electrode overlapping the voltage layer, an emission layer on the first electrode, and a second electrode on the emission layer.

2. The display apparatus of claim 1, wherein the voltage layer comprises a transparent conductive material.

3. The display apparatus of claim 1, further comprising a common voltage line arranged in the display area and electrically connected to the second electrode of the light-emitting diode, wherein the voltage layer has a same voltage level as a voltage level of the common voltage line.

4. The display apparatus of claim 3, wherein the common voltage line comprises a first common voltage line and a second common voltage line, which extend to cross each other in the display area, and the voltage layer corresponds to a portion of the first common voltage line.

5. The display apparatus of claim 4, further comprising an insulating layer between any one of the first common voltage line and the second common voltage line and the voltage layer, wherein the voltage layer is electrically connected to the one of the first common voltage line and the second common voltage line through a contact hole in the insulating layer.

6. The display apparatus of claim 1, further comprising a driving voltage line in the display area and electrically connected to the sub-pixel circuit, wherein the voltage layer has a same voltage level as a voltage level of the driving voltage line.

7. The display apparatus of claim 6, wherein the driving voltage line comprises a first driving voltage line and a second driving voltage line, which extend to cross each other in the display area, the voltage layer is electrically connected to the first driving voltage line through a contact hole defined in an insulating layer between the first driving voltage line and the voltage layer.

8. The display apparatus of claim 1, wherein the voltage layer overlaps an emission area of the light-emitting diode.

9. A display apparatus comprising:

a first light-emitting diode electrically connected to a first sub-pixel circuit in a first display area;

a second light-emitting diode in a second display area inside the first display area and electrically connected to a second sub-pixel circuit in an area different from the second display area;

a conductive bus line electrically connecting the second sub-pixel circuit and the second light-emitting diode to each other;

a data line electrically connected to one of a plurality of transistors of the first sub-pixel circuit and extending in a first direction in the first display area; and a voltage layer between the data line and a first electrode of the first light-emitting diode and overlapping the data line and the first electrode, wherein the voltage layer has a width greater than a width of the data line.

10. The display apparatus of claim 9, wherein the voltage layer comprises a same material as a material of the conductive bus line.

11. The display apparatus of claim 10, wherein each of the voltage layer and the conductive bus line comprises a transparent conductive oxide.

12. The display apparatus of claim 9, further comprising a common voltage line in the first display area and electrically connected to a second electrode of the first light-emitting diode, wherein the voltage layer has a same voltage level as a voltage level of the common voltage line.

13. The display apparatus of claim 12, wherein the common voltage line comprises a first common voltage line and a second common voltage line, which extend to cross each other in the first display area.

14. The display apparatus of claim 13, wherein the first common voltage line overlaps the first electrode of the first light-emitting diode.

15. The display apparatus of claim 14, wherein the voltage layer corresponds to a portion of the first common voltage line.

16. The display apparatus of claim 13, further comprising an insulating layer between any one of the first common voltage line and the second common voltage line and the voltage layer, wherein the voltage layer is electrically connected to the one of the first common voltage line and the second common voltage line through a contact hole in the insulating layer.

17. The display apparatus of claim 9, further comprising a driving voltage line in the first display area and electrically connected to the first sub-pixel circuit, wherein the voltage layer has a same voltage level as a voltage level of the driving voltage line.

18. The display apparatus of claim 17, wherein the driving voltage line comprises a first driving voltage line and a second driving voltage line, which extend to cross each other in the first display area, the voltage layer is electrically connected to the first driving voltage line through a contact hole defined in an insulating layer between the first driving voltage line and the voltage layer.

19. The display apparatus of claim 9, wherein the voltage layer overlaps an emission area of the first light-emitting diode.

20. The display apparatus of claim 9, further comprising a component overlapping the second display area and comprising a sensor or a camera.

* * * * *